United States Patent
Fukuda et al.

(10) Patent No.: US 6,180,872 B1
(45) Date of Patent: Jan. 30, 2001

(54) PROCESS AND APPARATUS FOR GROWING CRYSTALLINE SILICON PLATES BY PULLING THE PLATE THROUGH A GROWTH MEMBER

(75) Inventors: Tsuguo Fukuda, Sendai; Minoru Imaeda; Yuichiro Imanishi, both of Nagoya, all of (JP)

(73) Assignee: NGK Insulators, Ltd., Nagoya (JP)

( * ) Notice: Under 35 U.S.C. 154(b), the term of this patent shall be extended for 0 days.

(21) Appl. No.: 09/528,070

(22) Filed: Mar. 17, 2000

Related U.S. Application Data

(63) Continuation of application No. 08/897,945, filed on Jul. 24, 1997, now Pat. No. 6,072,118.

(30) Foreign Application Priority Data

Jul. 29, 1996 (JP) .................................................... 8-198967

(51) Int. Cl.⁷ ............................ C30B 15/34; H01L 21/268
(52) U.S. Cl. ........................................... 136/258; 264/212
(58) Field of Search ..................................... 136/258, 252; 264/212

(56) References Cited

U.S. PATENT DOCUMENTS

| | | | |
|---|---|---|---|
| 4,233,338 | 11/1980 | Ricard et al. | 136/258 |
| 4,363,769 | 12/1982 | Tsuya et al. | 136/258 |
| 4,481,235 | 11/1984 | Foell et al. | 136/258 PC |
| 4,565,600 | 1/1986 | Ricard | 156/608 |

FOREIGN PATENT DOCUMENTS 1 490 114   10/1977   (GB) .

*Primary Examiner*—John Goodrow
(74) *Attorney, Agent, or Firm*—Burr & Brown

(57) ABSTRACT

A process for growing a crystalline silicon plate, including the steps of arranging a planar growth member and a growth crucible in which a melt of silicon is placed and which is provided with a melt draw-out opening at a lower side thereof, while at least a tip portion of the growth member is located under the draw-out opening, drawing out the melt from the crucible through the draw-out opening, bringing the drawn out melt into contact with the tip portion of the growth member, and further pulling down the melt through the tip portion of the growth member.

23 Claims, 18 Drawing Sheets

FIG_1
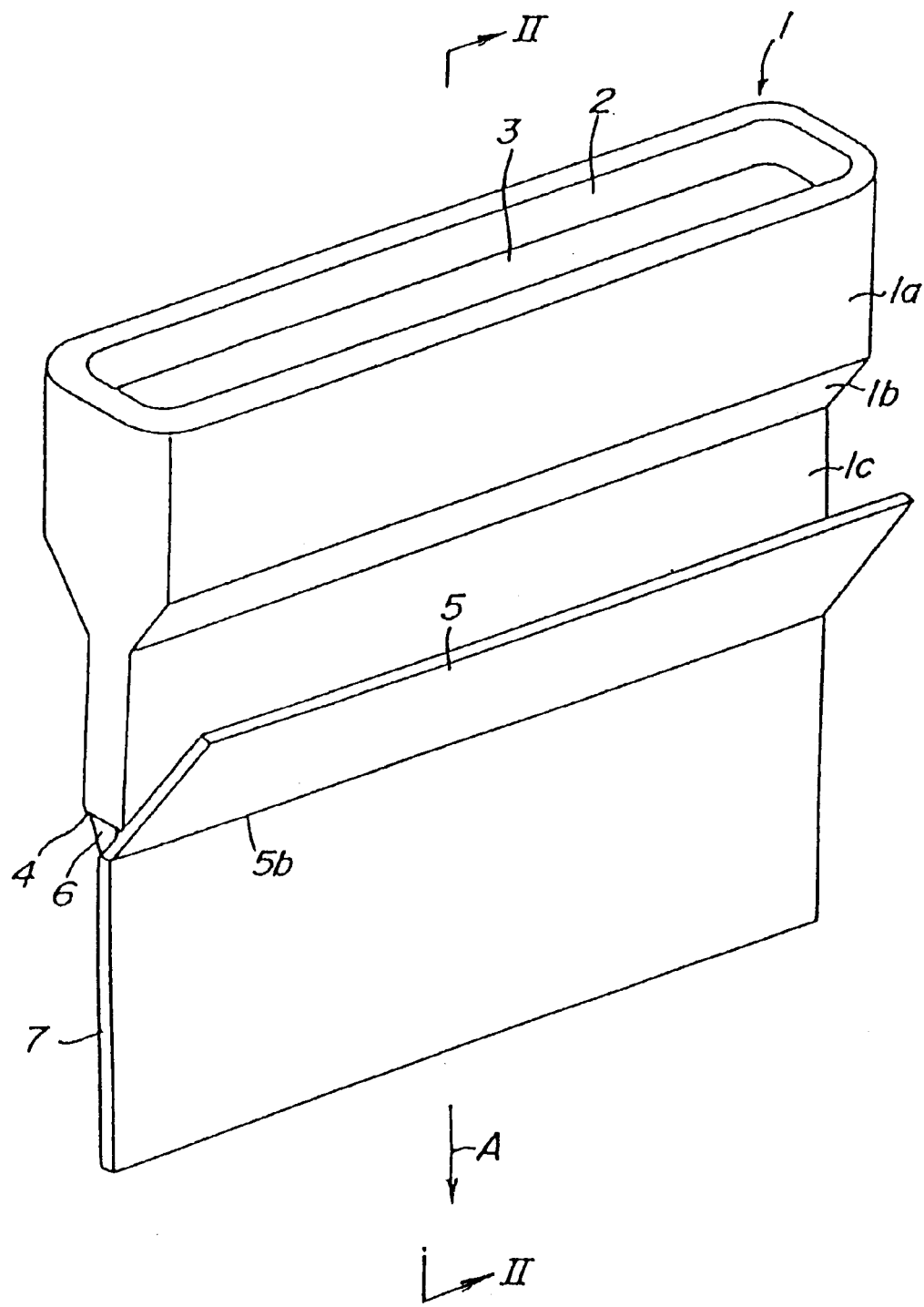

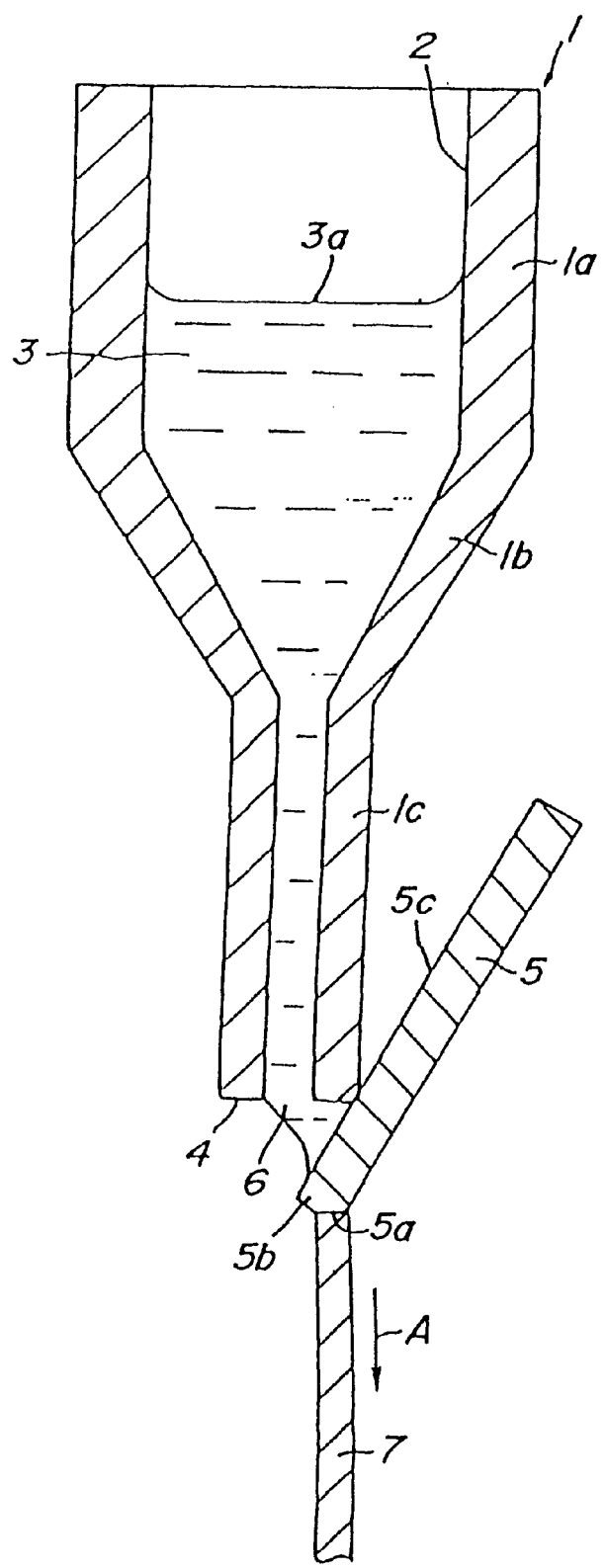
FIG_2

FIG_3
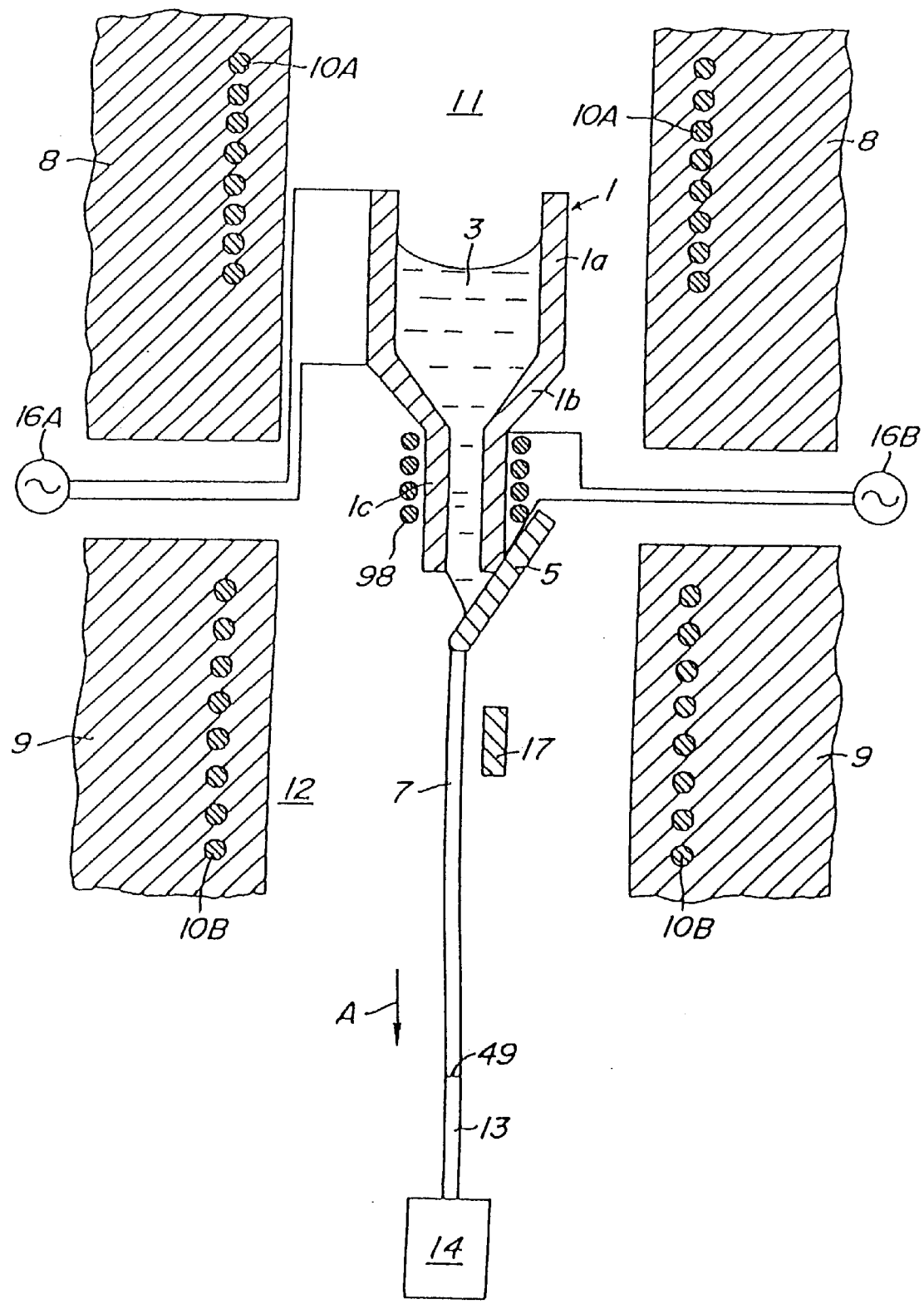

FIG._4a
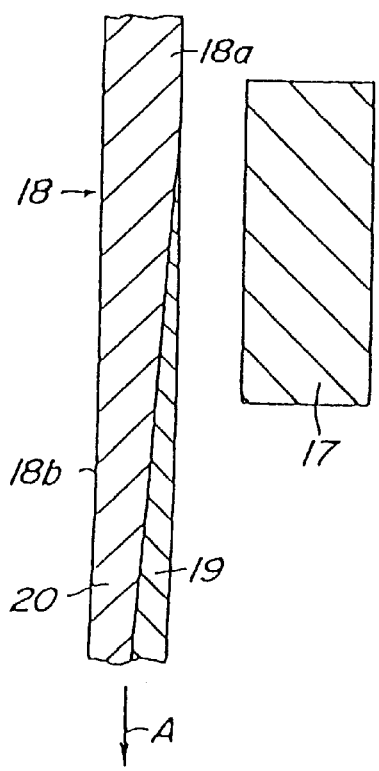
FIG._4b
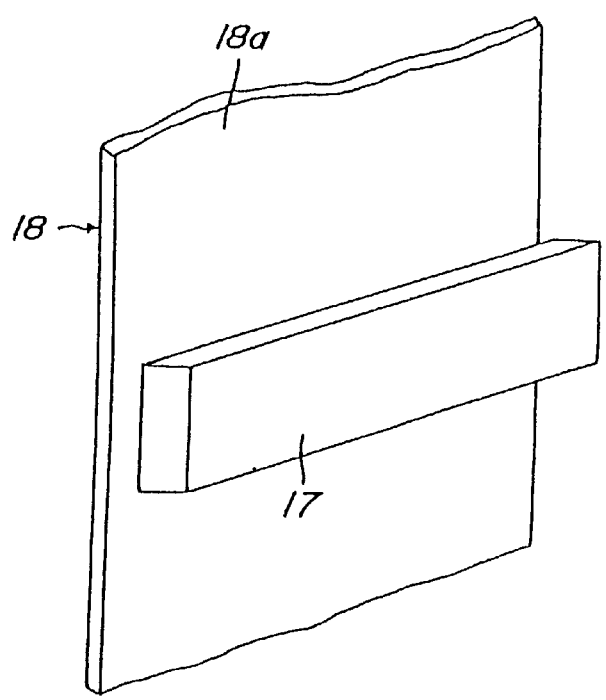
FIG._4c
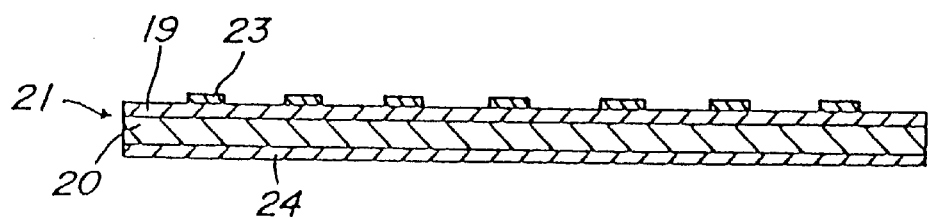

FIG_6
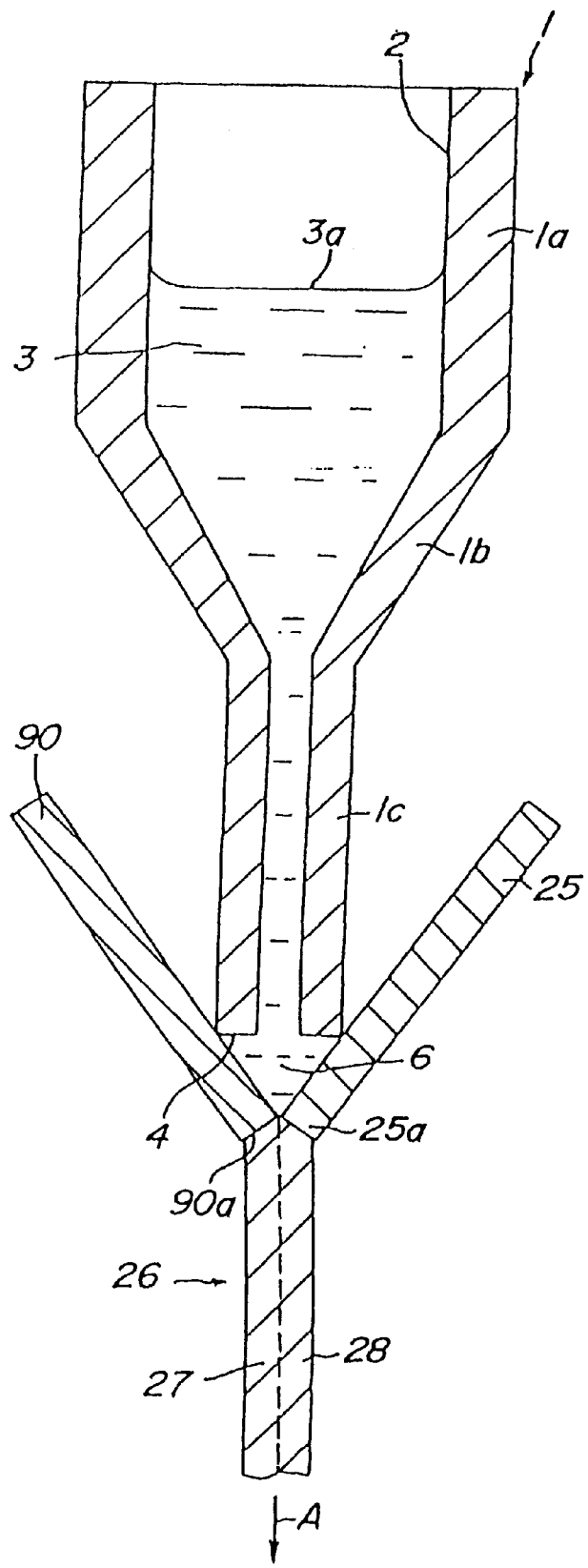

FIG_7a
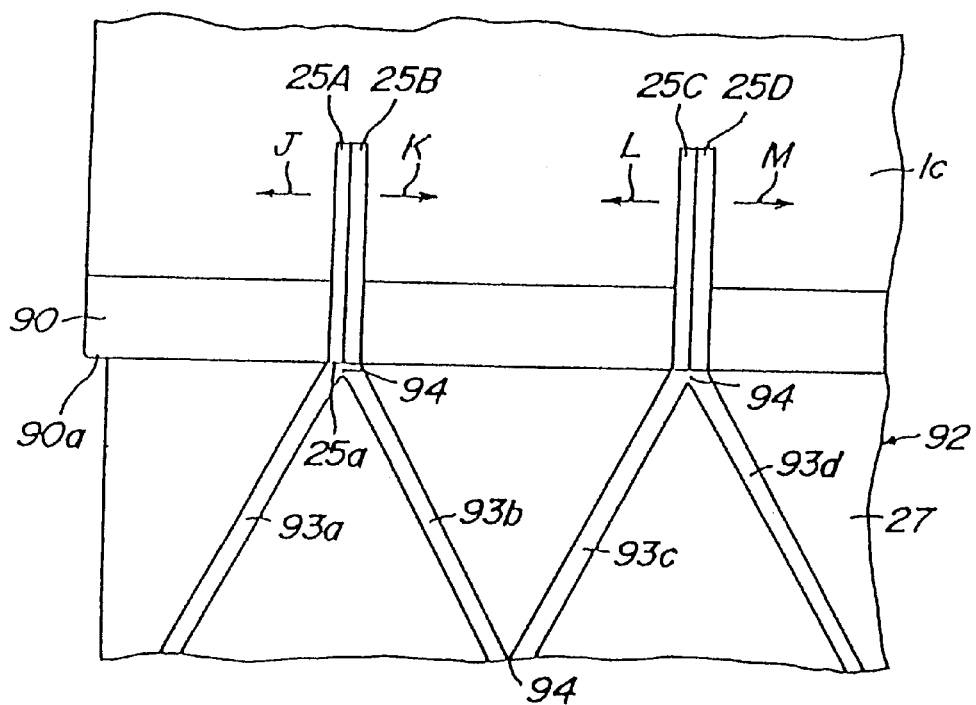
FIG_7b
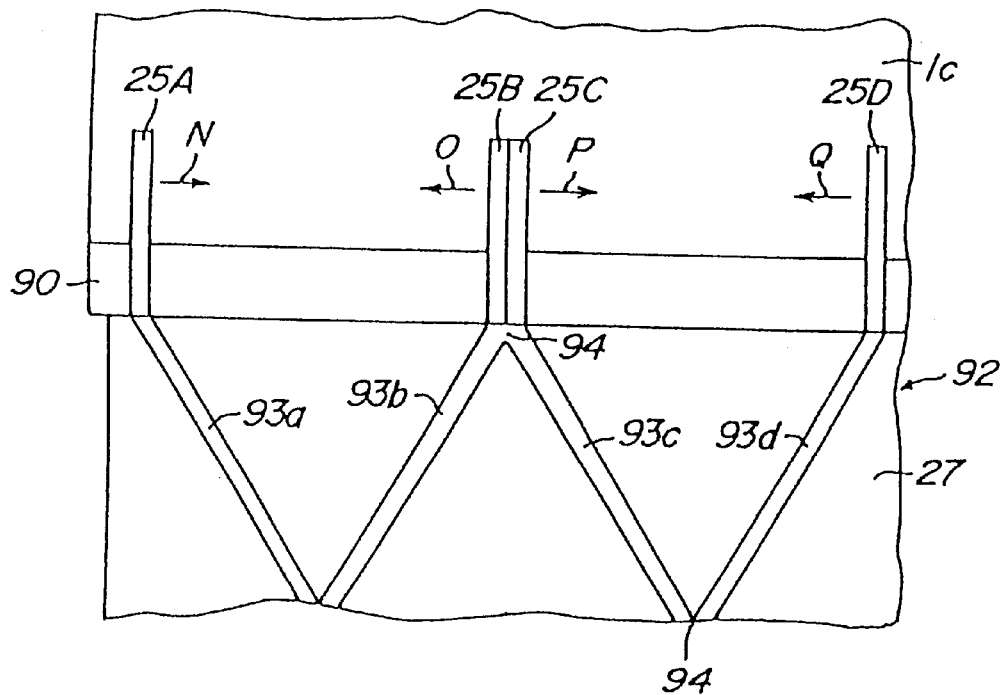

FIG_8a
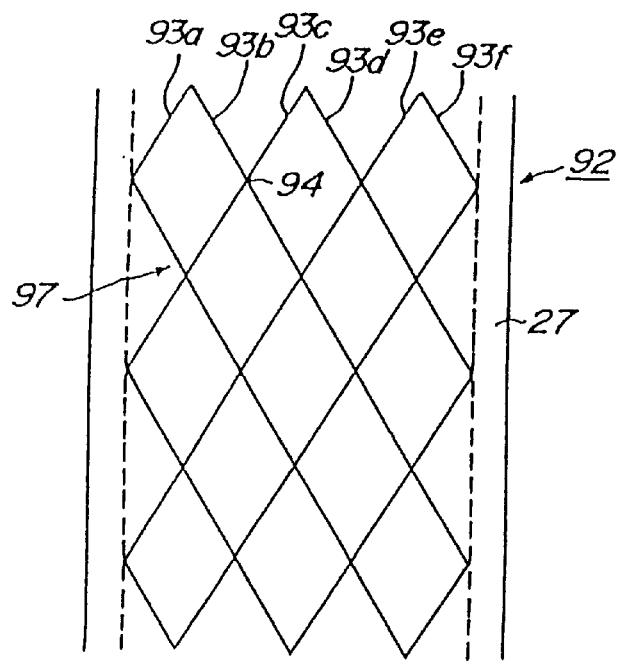
FIG_8b
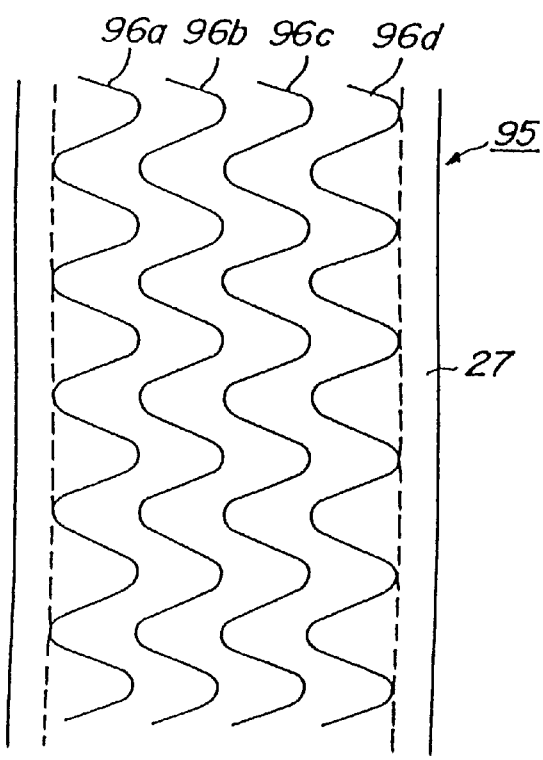

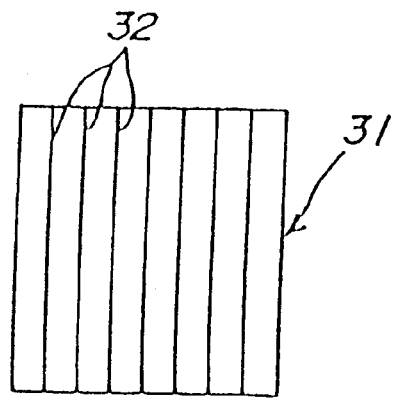
FIG_9a
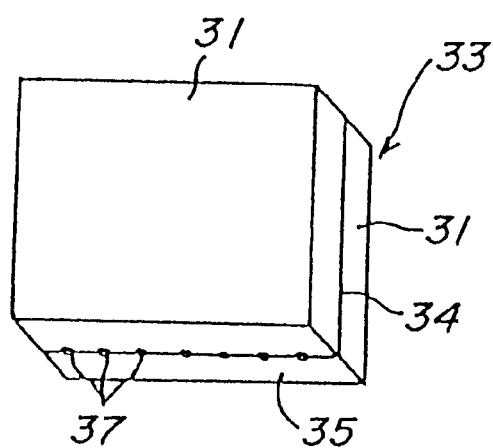
FIG_9b
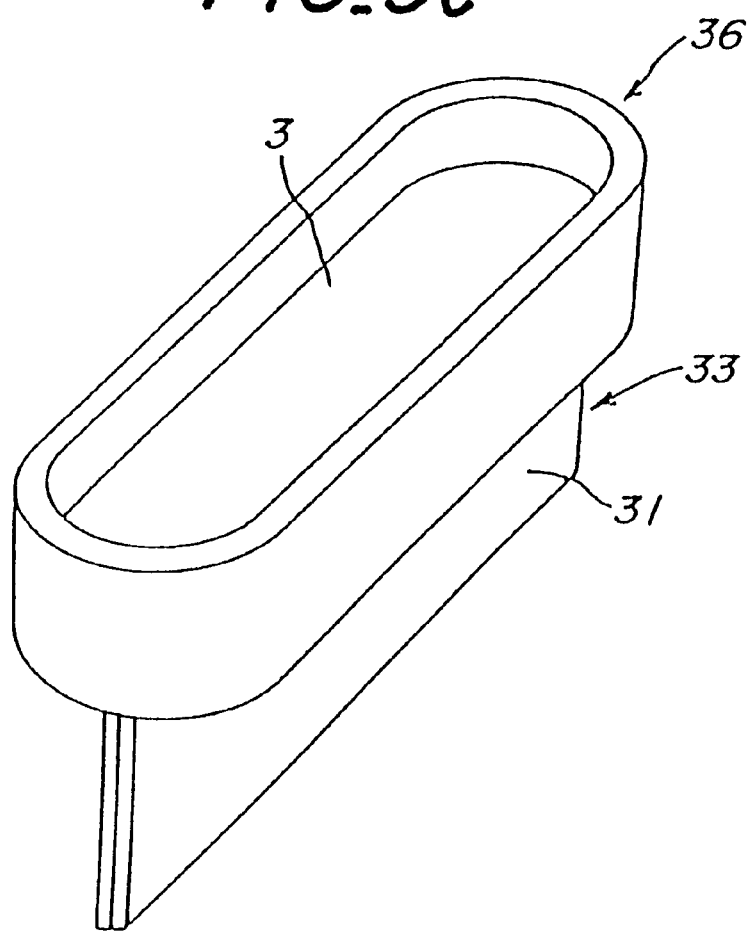
FIG_9c

FIG_10
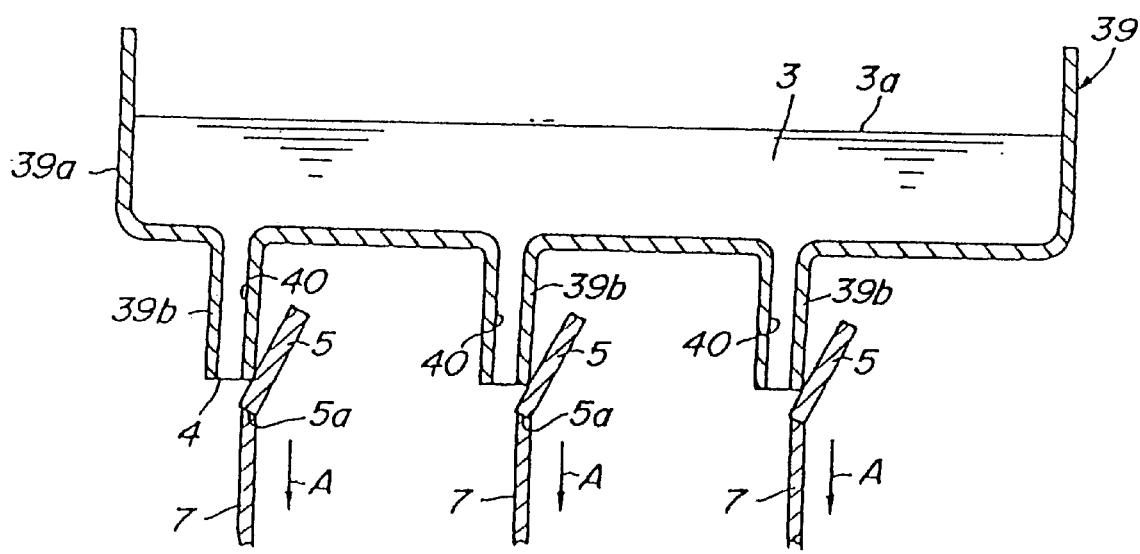

FIG_12
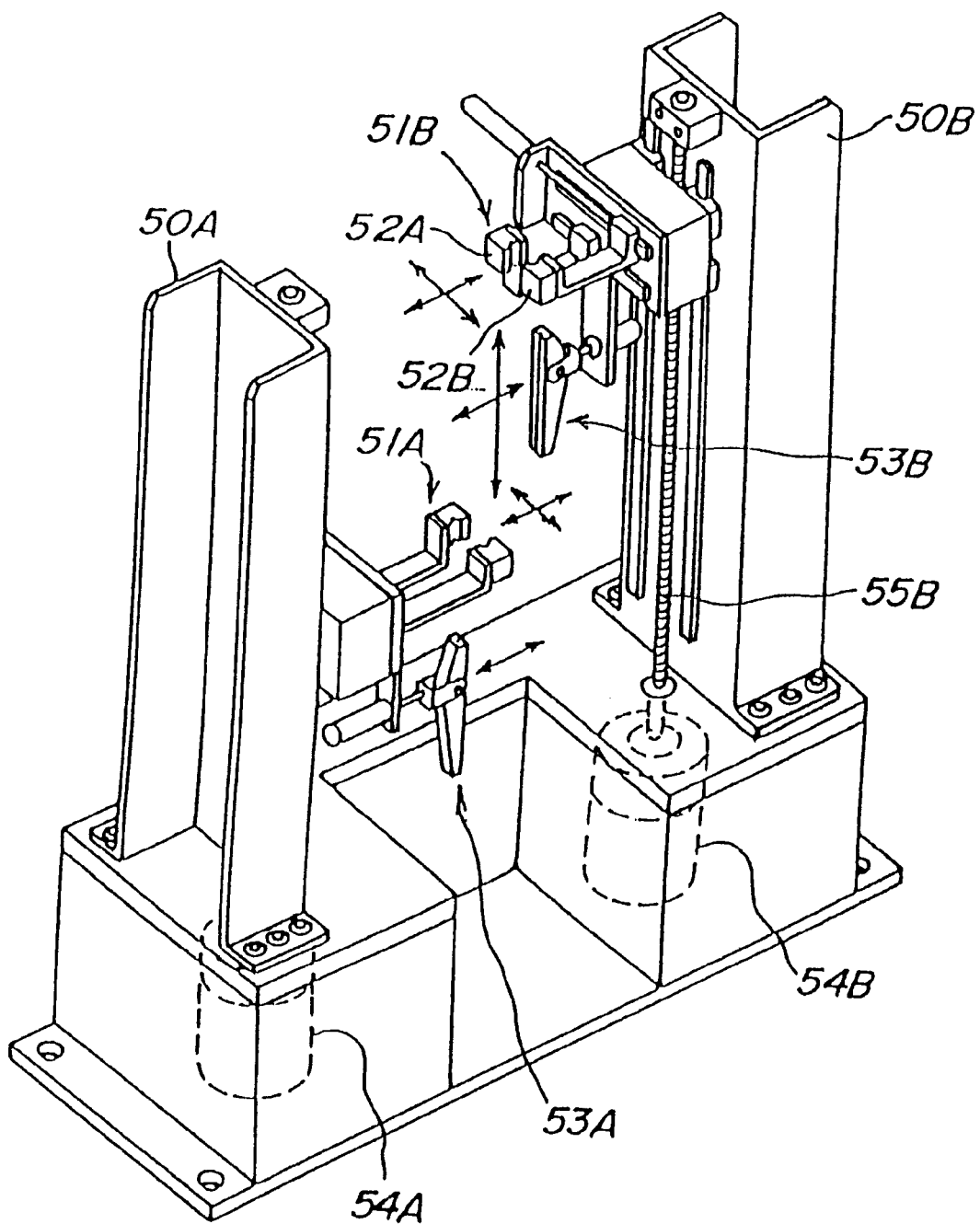

FIG_13
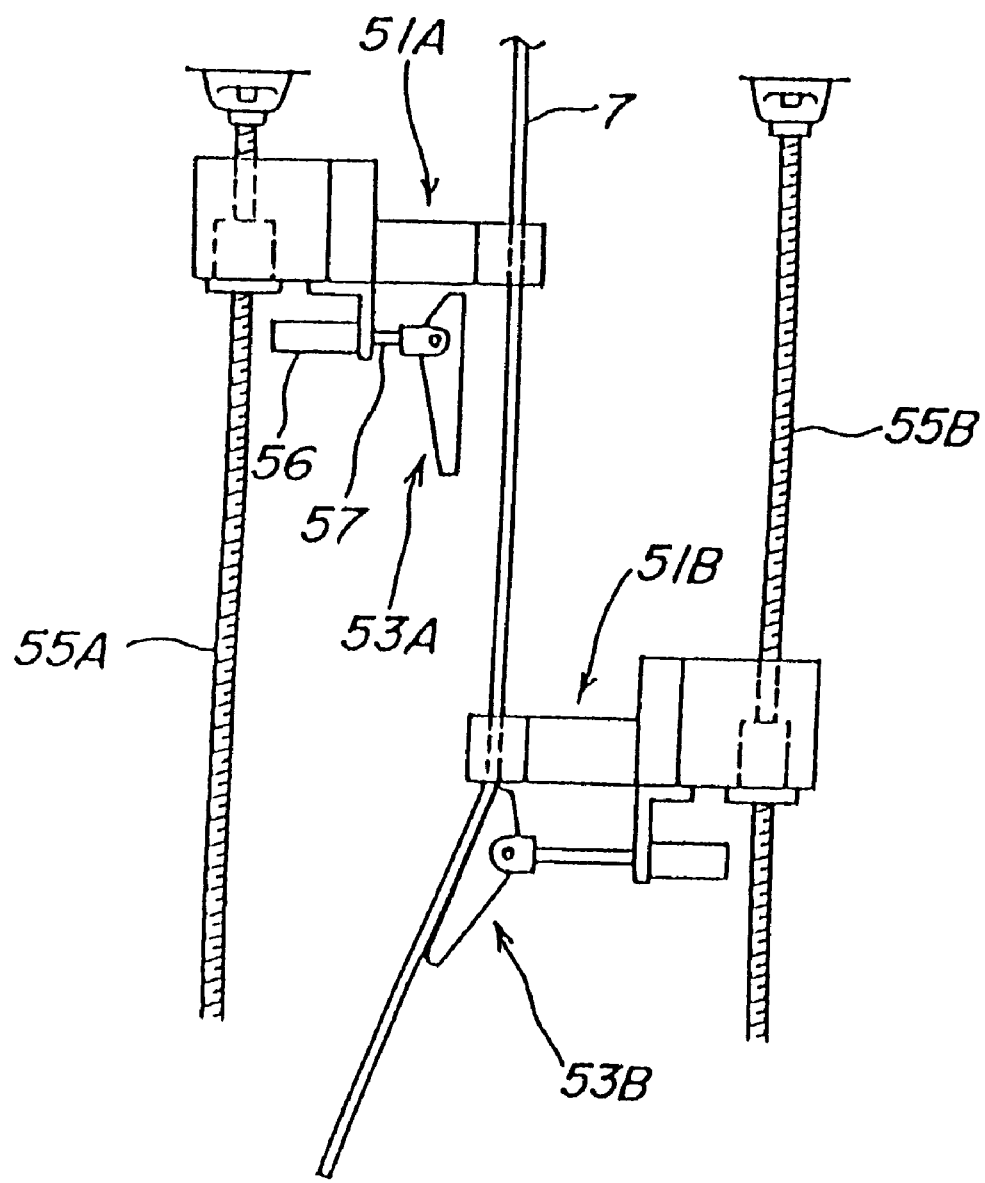

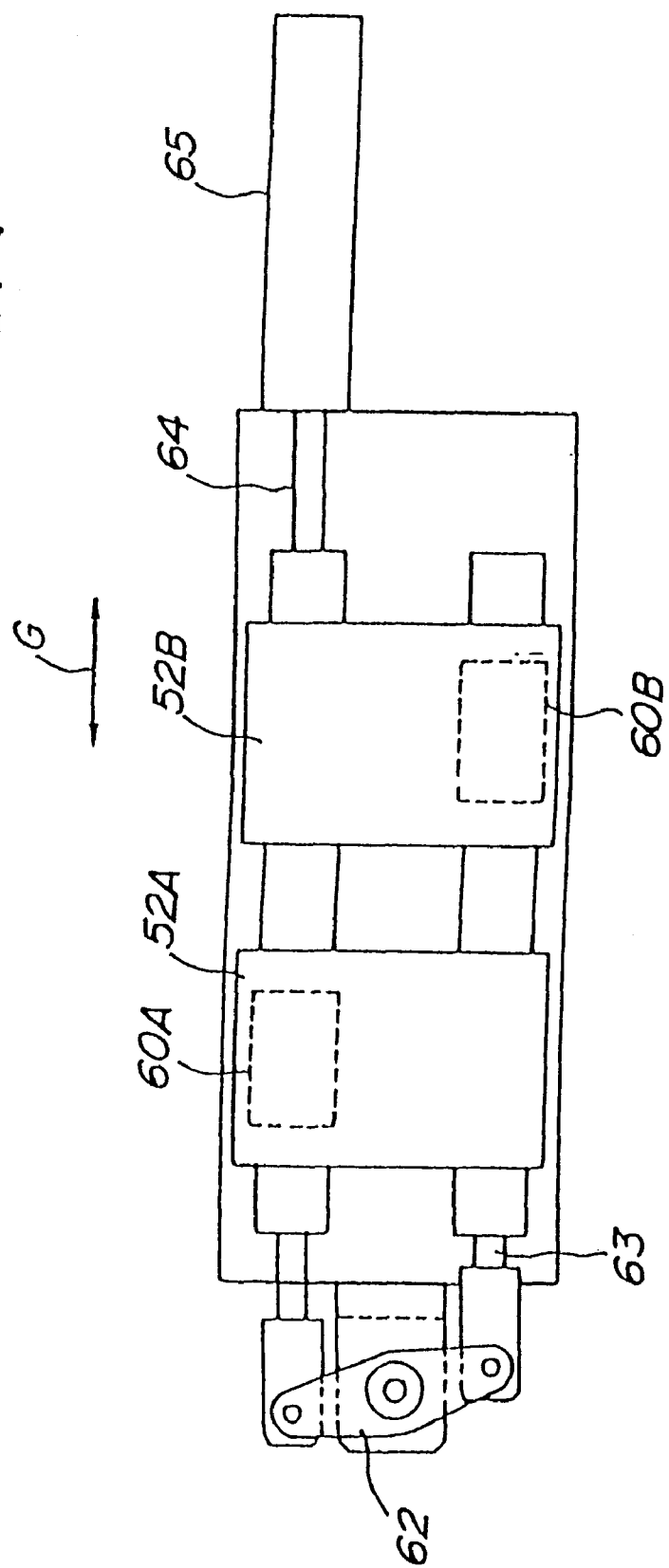

FIG._15
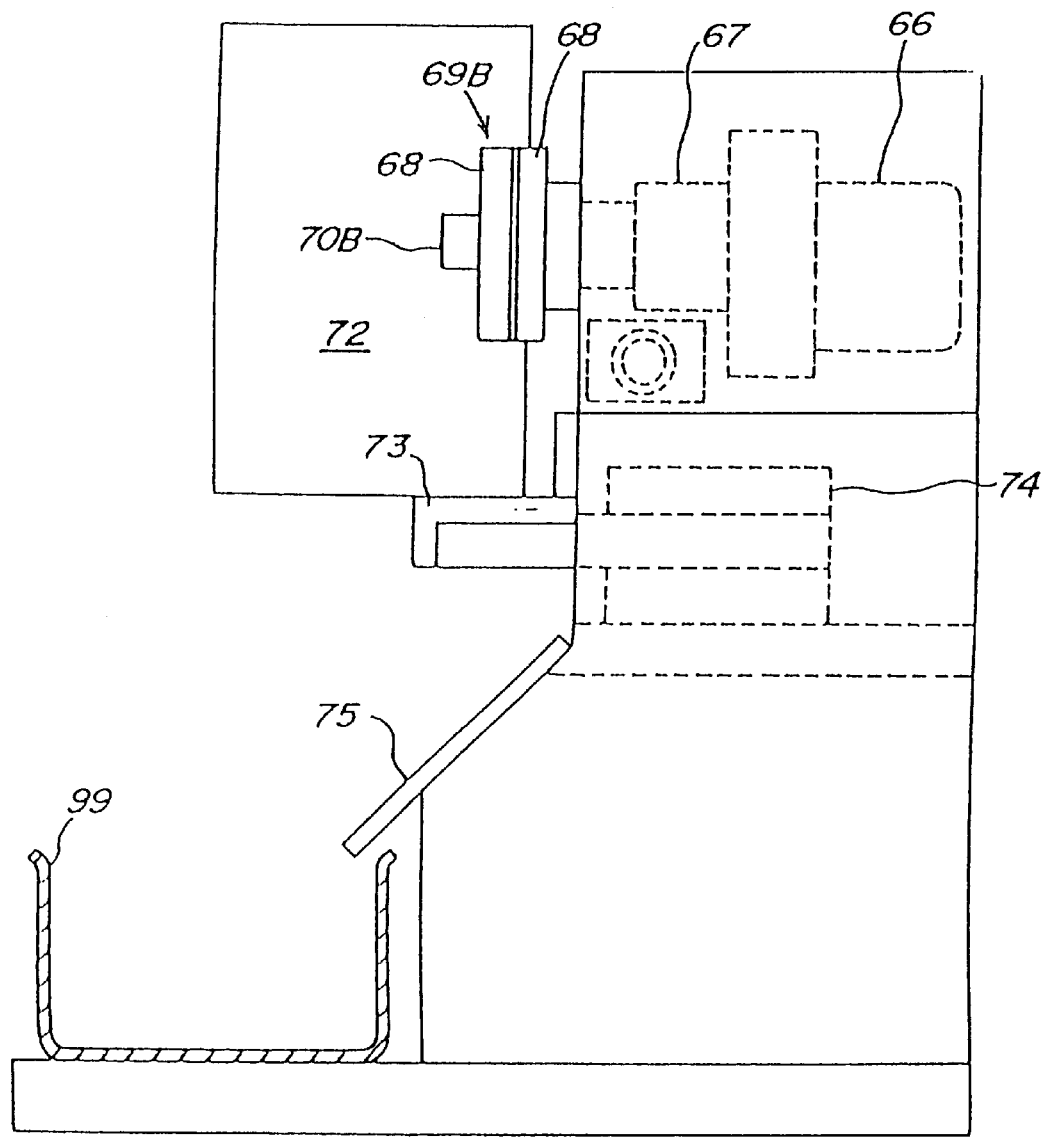

FIG_16
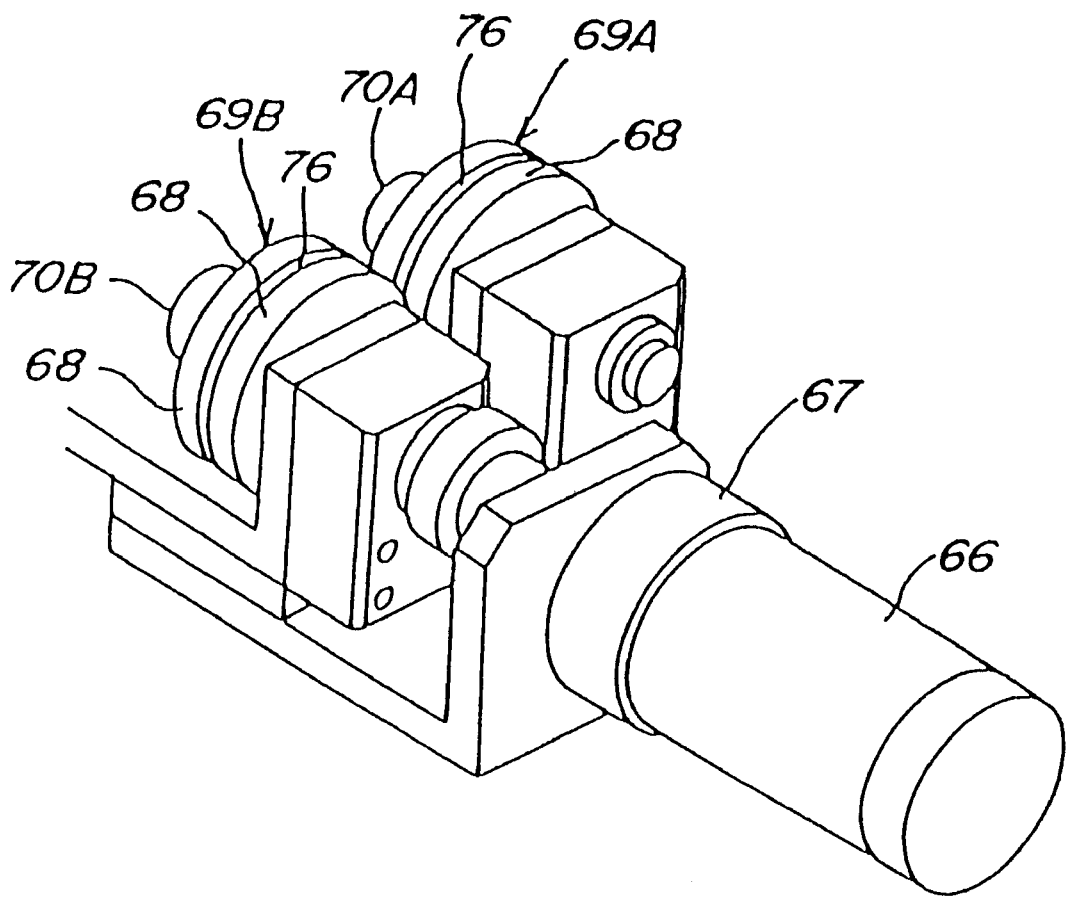

FIG_17a
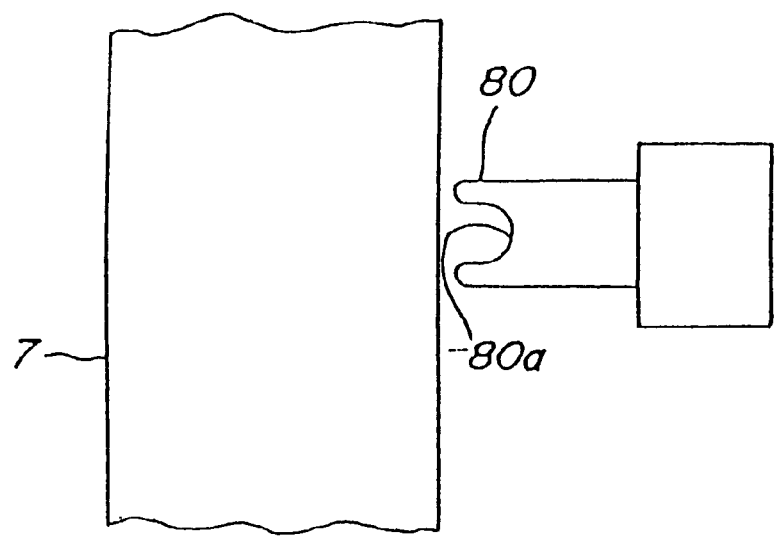
FIG_17b
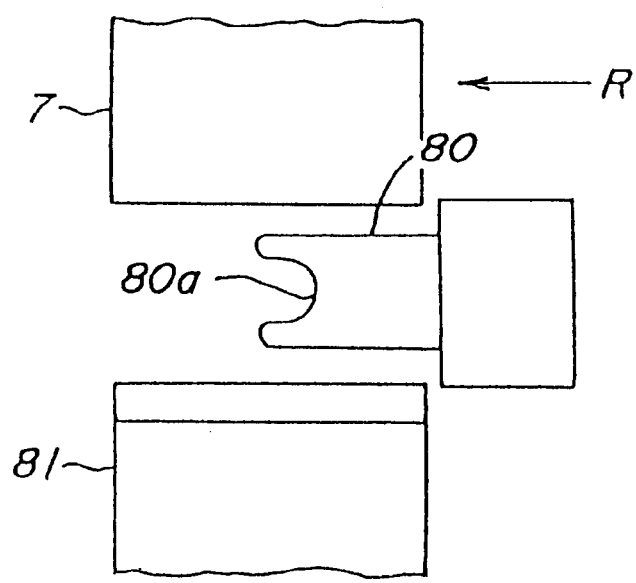

FIG_18a
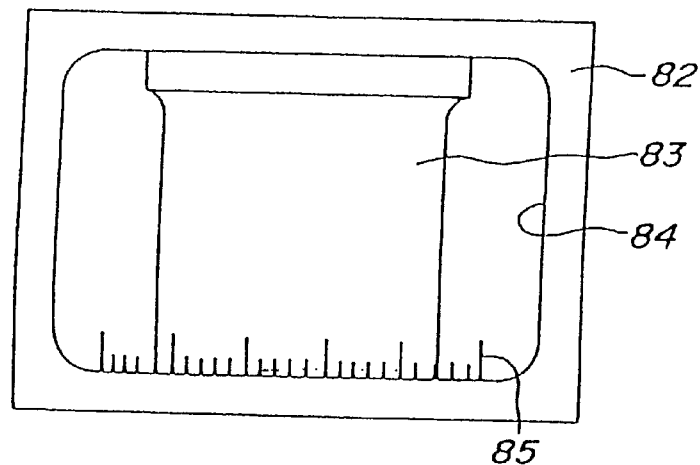
FIG_18b
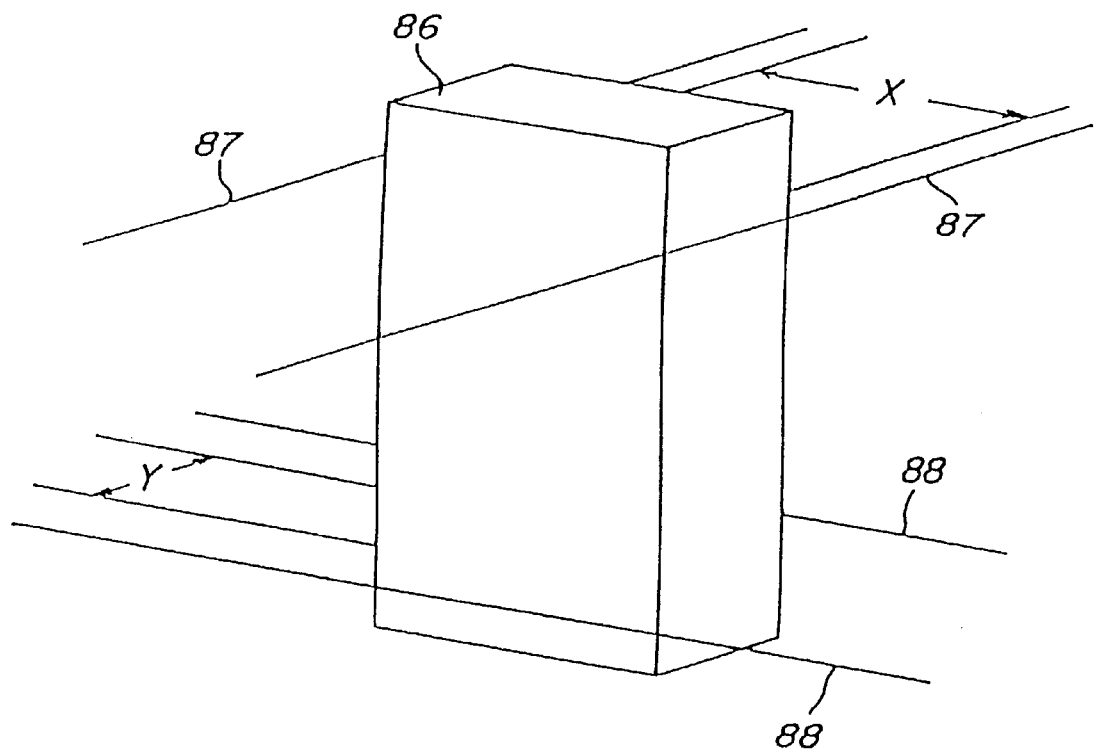

PROCESS AND APPARATUS FOR GROWING CRYSTALLINE SILICON PLATES BY PULLING THE PLATE THROUGH A GROWTH MEMBER

CROSS REFERENCE TO RELATED APPLICATION

This is a continuation application of U.S. Ser. No. 08/897,945, filed Jul. 24, 1997, now U.S. Pat. No. 6,072,118, the entirety of which is incorporated herein by reference.

BACKGROUND OF THE INVENTION (1) Field of the Invention

The present invention relates to crystalline silicon plates, a process for growing crystalline silicon plates, a crystalline silicon plate-growth apparatus, and solar cell elements using crystalline silicon plates as substrates.

(2) Related Art Statement

The crystalline silicon solar cell is produced by the four steps of preparing a raw silicon material, producing a substrate from the raw silicon material, forming a cell structure on the substrate, and converting the cell structure into a module. The silicon substrate is ordinarily produced by the Czochralski process (CZ process: pulling-up process) (See "Cell Manual" published by Maruzen Co., Ltd.). Further, a lateral type crystal continuous growth apparatus has been known for growing silicon crystal plates for solar cells.

However, in such a lateral type crystal continuous growth apparatus, it was impossible to uniformly and continuously grow a crystalline silicon plate having an extremely small thickness. For example, a thickness of less than 200 $\mu$m. On the other hand, according to the Czochralski process, a cylindrical silicon crystal may be grown, but then must be cut. Furthermore, it is known that a crystalline silicon plates can be made by growing a polycrystal body according to the casting process and cutting it. However, according to such growing methods, a large percentage the silicon crystal which cut is thrown away. As a result, a lot of the material is wasted, resulting in a high crystal-growing production cost. Therefore, it is difficult to reduce production costs the solar cell element. Since silicon is scarce as a natural source and its material cost is high, this leaded to increase in the production cost of silicon based solar cell elements.

In order to produce the solar cell element, a P-type or N-type diffusion area is formed at a surface of a crystalline silicone plate by diffusing a dopant element thereinto to obtain a P-N junction. However, such a diffusing process is complicated, which is a large factor to raise the production cost.

SUMMARY OF THE INVENTION

It is an object of the present invention to uniformly and continuously grow a crystalline silicon plate having an extremely small thickness of less than 200 $\mu$m.

A first aspect of the present invention relates to a process for growing a crystalline silicon plate, comprising the steps of arranging a planar growth member and a growth crucible in which a melt of silicon is placed and which is provided with a melt draw-out opening at a lower side thereof, while at least a tip portion of the growth member is located under the draw-out opening, drawing out the melt from the crucible through the draw-out opening, bringing the drawn out melt into contact with the tip portion of the growth member, and growing the crystalline silicon plate by further pulling down the melt through the tip portion of the growth member.

The present invention also relates to a crystalline silicon plate-growth apparatus including a growth crucible in which a melt of silicon is placed and which is provided with a melt draw-out opening at a lower side thereof, a planar growth member and a driving mechanism, at least a tip portion of the growth member being located under the draw-out opening of the growth crucible, and said driving mechanism being adapted to bring the melt drawn out through the draw-out opening into contact with the tip portion of the growth member and further pull down the crystalline silicon plate through the tip portion of the growth member.

The present inventors came to a technical idea that a growth crucible in which a melt of silicon is placed and which is provided with a melt draw-out opening at a lower side thereof as well as a planar growth member are arranged such that at least a tip portion of the growth member is located under the draw-out opening of the growth crucible, and the melt is drawn out from the crucible through the draw-out opening, and brought into contact with the drawn out melt into contact with the tip portion of the growth member, and then the resulting crystalline silicon plate is further pulled down through the tip portion of the growth member. At that time, the melt is gradually drawn through the draw-out opening, moves along the surface of the tip portion of the growth member, while a very small melt reservoir is formed above the tip portion of the growth plate, and the melt is pulled down during which the melt is being crystallized. As a result, the inventors discovered that a crystalline silicon plate having a thickness of 5 to 200 $\mu$m could be grown at a speed of 100 to 10000 mm/hr.

In the present invention, the thickness of the crystalline silicon plate is more preferably 10–150 $\mu$m. Particularly, if such a crystalline silicon plate is used for a solar cell element, the thickness of the crystalline silicon plate is preferably 20–100 $\mu$m.

In the production of the crystalline silicon based solar power generating element, an important problem was in reducing the amount of silicon used to produce these elements. To accomplish this the present inventors' invented a process which allows a crystalline silicon plate having an extremely small thickness of not more than 200 $\mu$m to be continuously pulled down. This crystalline silicon plate can be immediately used as a solar cell element after electrodes are formed thereon, while the surface of the plate is left as it is or the surface is slightly polished. That is, after the crystalline silicon plate is pulled down, it can be used in a given length as it is and no cutting is necessary. Therefore, the silicon material is not wasted. Further, the growing speed is high.

At least the tip portion of the growth member may be located under the draw-out opening of the growth crucible in any of the following ways, for example.

(1) The growth member is arranged on one side of the crucible or on one side of the nozzle extending from the crucible in the state that the tip portion of the growth member is located immediately under the draw-out opening of the crucible. The melt flows in a melt reservoir defined between the draw-out opening and the growth member.

(2) The growth member is inserted into the crucible, while the tip portion of the growth member is partially projected through and out of the draw-out opening.

At least the tip portion of the growth member is preferably made of a material stable at the melting temperature of the melt of silicon, for example, at 1400° C. For instance, at least the tip portion of the growth member is made of silicon carbide, boron nitride, silicon oxide or carbon. Further, although the tip portion of the growth member may be integrally formed with the remainder, the tip portion of the growth member is preferably made of a bundle of numerous fibers. In this case, the configuration of the growth member may be easily adjusted according to the dimension of the crystalline silicon plate grown, the draw-down speed, a temperature surrounding near a draw-down point, etc.

Preferably, the growth member is made of a plurality of carbon fibers or silicon carbide fibers. If carbon fibers are used, the carbon fibers react with a melt of silicon, so that the carbon fibers may be converted to silicon carbide from the surface to the interior.

The fibers, particularly, the carbon fibers and silicon carbide fibers, which constitutes the growth member, preferably have the diameter of 5 to 20 $\mu$m.

These and other features, objects and advantages of the invention will be appreciated upon reading of the following description of the invention when taken in conjunction with the attached drawings, with the understanding that some modifications, variations and changes could easily be made by the skilled person in the art to which the invention pertains.

BRIEF DESCRIPTION OF THE INVENTION

For a better understanding of the invention, reference is made to the attached drawings, wherein:

FIG. 1 is a perspective view of the structure of the growth apparatus according to one embodiment of the present invention near a crucible;

FIG. 2 is a sectional view of the structure in FIG. 1 along a line II—II;

FIG. 3 is a sectional view for schematically illustrating a state in which the crucible and so forth in FIGS. 1 and 2 are accommodated in a furnace body;

FIG. 4($a$) is a sectional view for illustrating the state that a diffusing member 17 is placed on a side of one of main planes of a crystalline silicon plate 18 continuously grown, FIG. 4($b$) is a perspective view of FIG. 4($a$), and FIG. 4($c$) is a sectional view of an embodiment of a solar cell element;

FIG. 6 is a sectional view of the structure shown in FIG. 5 along a line VI—VI;

Figure 5:
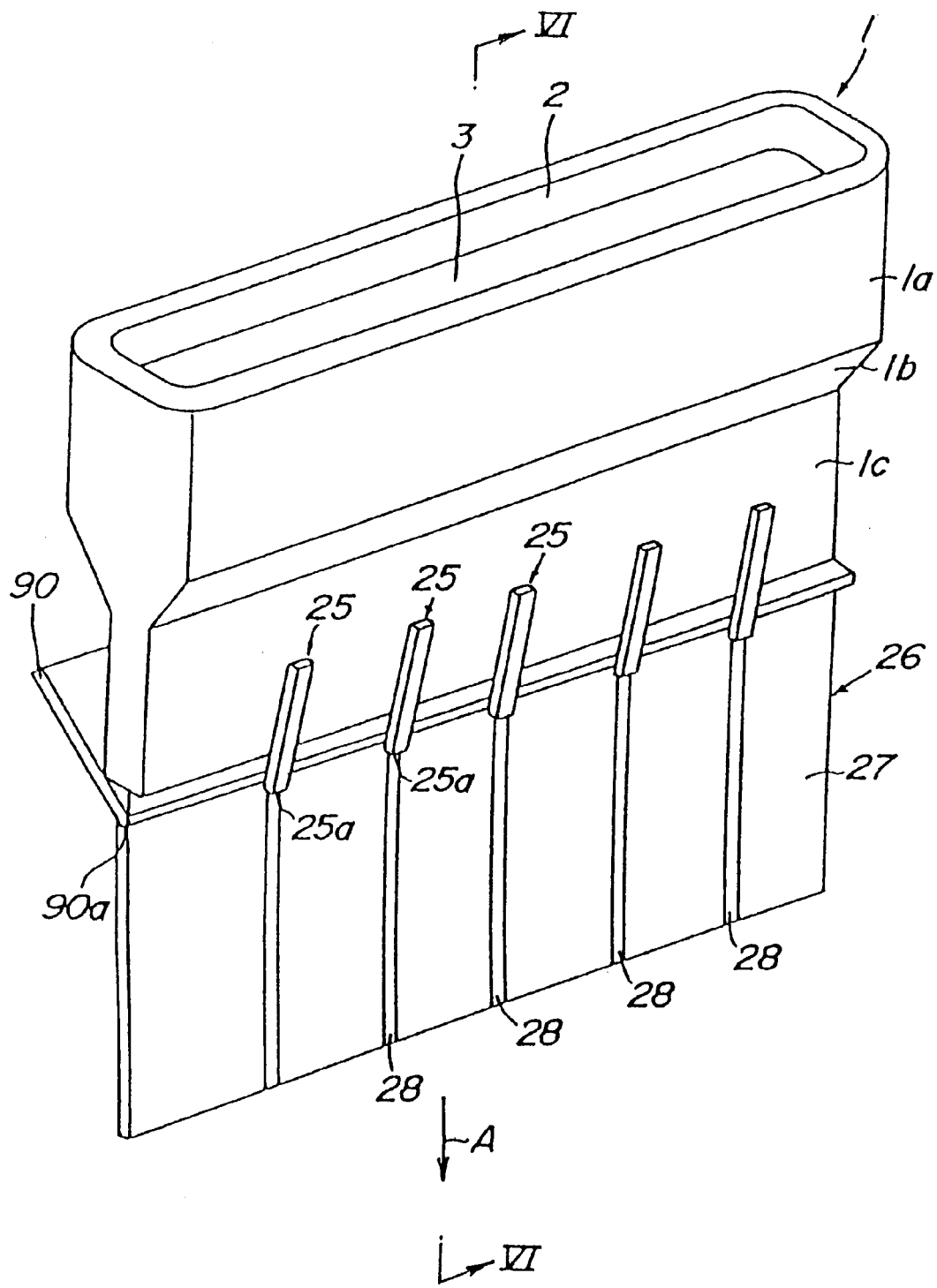
FIG. 5 is a perspective view for schematically illustrating a structure of the growth apparatus according to a further embodiment of the present invention near a crucible.
Figure 11:
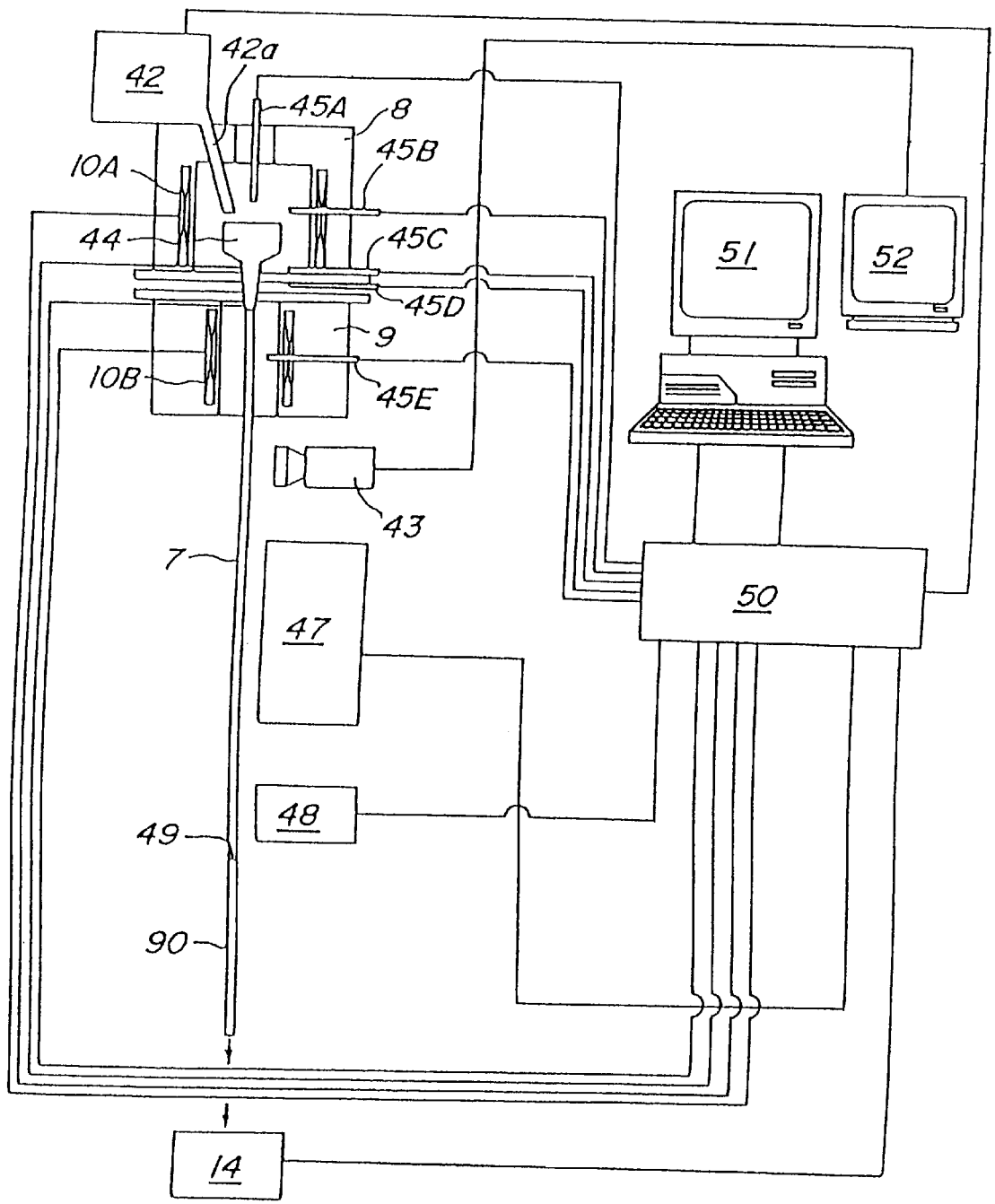

FIGS. 7($a$) and 7($b$) are front views illustrating the steps of continuously forming reinforcing projections in a lattice fashion by using plural projection-forming members;

FIG. 8($a$) is a front view for illustrating a crystalline silicon plate at which reinforcing projections 97 are formed in a lattice fashion, and FIG. 8($b$) is a front view for illustrating a crystalline silicon plate 95 at which wavy reinforcing projections are formed;

FIG. 9($a$) is a front view of a planar plate 31 at which plural rows of slender grooves 32 are formed in parallel to one another, FIG. 9($b$) is a perspective view of a planar nozzle portion 33 formed by bonding such planar plates 31 to each other, and FIG. 9($c$) is a perspective view for illustrating a state in which the nozzle portion 33 is joined to a bottom portion of a crucible having an almost rectangular sectional shape;

FIG. 10 is a sectional view for illustrating a further embodiment of the present invention using a crucible 39 provided with plural nozzle portions 39$b$;

FIG. 11 is a block diagram for schematically showing the entire growth apparatus as a preferred embodiment of the present invention;

FIG. 12 is a perspective view a holding device and a cutting device for the crystalline silicon plate as an embodiment;

FIG. 13 is a front view of a principal portion of the holding/cutting devices in FIG. 12;

FIG. 14 is a front view of a driving mechanism for the holding device in FIG. 12;

FIG. 15 is a front view of a plate feeding device and a plate cutting device using rollers;

FIG. 16 is an enlarged perspective view of the feeding device using the rollers shown in FIG. 15;

FIG. 17($a$) is a front view of a cutting device using a heater; and

FIG. 17($b$) is a front view of illustrating a state that a plate is cut by the heater 80; and FIG. 18($a$) is a front view of a monitor to be used in a device for observing the shape and the dimension of the crystalline silicon plate, and FIG. 18($b$) is a schematically perspective view for illustrating an embodiment in which the shape and the dimension of the plate 86 are measured by using laser beams.

DETAILED DESCRIPTION OF THE INVENTION

FIG. 1 is a perspective view for schematically illustrating an embodiment of the present invention in which a crystalline silicon plate 7 is being pulled down from a crucible 1. FIG. 2 is a schematic sectional view of FIG. 1. A melt 3 of silicon is charged in a space 2 inside the slender crucible 1. The reference numeral 3$a$ is a surface of the melt 3. The melt 3 is charged into a main body 1$a$ of the crucible 1, a throttled portion 1$b$ is formed under the main body 1$a$, and a nozzle portion 1$c$ having a planar shape is formed at a lower end of the throttled portion 1$b$. A planar growth member 5 is arranged on a side of the nozzle portion 1$c$ in the state that the growth member 5 is inclined at a given angle relative to the nozzle portion 1$c$. The inclined angle is preferably 10° to 15°. A tip portion 5$b$ of the growth member 5 is arranged immediately under an opening, i.e., a draw-out opening 4, at a lower end of the nozzle portion 1$c$.

The melt is flown down through the draw-out opening 4, passed through a melt reservoir 6 defined by the tip portion 5$b$ of the growth member 5 and the draw-out opening 4 of the throttled portion 1$c$, flown along a main plane 5$c$ of the growth plate 5, and drawn down through a bottom face 5$a$ of the tip portion 5$b$ of the growth plate 5. During the above procedure, the melt is crystallized into a crystallized silicon plate 7. The inventors succeeded in continuously growing a crystallized silicon plate having an extremely small thickness of not more than 200 $\mu$m but not more than 100 $\mu$m by pulling down the crystallized silicon plate in an A-arrow direction.

In the crystalline silicon plate-growth apparatus according to the present invention, heating of the crucible is not limited to any particular way. However, it is preferable to arrange a heating furnace to surround the plate-growth apparatus. In this case, it is preferable that the heating furnace is divided into upper and lower furnace bodies such that the crucible is surrounded by the upper furnace body. Preferably, the upper furnace body is heated at a relatively higher temperature to melt the powder inside the crucible. On the other hand, the lower furnace body is arranged around the nozzle portion, and the temperature of the lower furnace body is set at a relatively low temperature, so that the temperature gradient in the crystal-growth section at the lower end of the nozzle portion is set greater.

To enhance the melting efficiency of the powder inside the crucible, it is preferable to make the melt 3 generate heat itself by applying high frequency electric power to the melt 3 of silicon rather than by heating the crucible through only heating the furnace around the crucible. Furthermore, in order to keep the melt flowing down inside the nozzle portion in a molten state, it is preferable that the nozzle portion is made of a carbonaceous material coated by pyrolytic BN and heat is generated in the silicon melt inside the nozzle portion by feeding the radio frequency heating power to this nozzle portion.

In order to increase the temperature gradient particularly in the crystal growth section, it is preferable that a crucible-heating mechanism and a nozzle-heating are separately provided and independently controllable.

According to the present invention, a diffusion member composed of a compound including an element being capable of diffusing into the crystalline silicon plate through its surface may be arranged under at least the tip portion of the growth member so that while the crystalline silicon plate is being pulled down under the crucible, the element may be diffused into a surface area of the crystalline silicon plate from the diffusion member in the state that each of the diffusion member and the crystalline silicon plate is adjusted to a temperature suitable for the diffusion.

The inventors tried the following, for example. That is, while a crystalline silicon plate was being pulled down from a melt of silicon containing around $10^{13}$ to $10^{15}$ cm$^{-3}$ of phosphorus according to the invention process, the silicon plate was grown at near the melting pint of 1410° C. of silicon. A planar member made of BN was arranged under the growing plate, and boron was tried to be diffused into the crystalline silicon plate from one main plane thereof in the state that the temperature of an area where the planar member was arranged was held at near 500 to 1200° C. As a result, it was found that boron was diffused into the crystalline silicon plate at a concentration of $10^{13}$ to $10^{15}$ cm$^{-3}$.

FIG. 3 is a sectional view for schematically illustrating another embodiment of the crystalline silicon plate-growth apparatus according to the present invention. The same or similar members as shown in FIGS. 1 and 2 are given same reference numerals, and their explanation is omitted. An upper furnace body 8 is arranged to surround a crucible 1 and an upper space 11. A heater 10A is buried in the upper furnace body 8. A nozzle portion 1c extends downwardly from the lower end of the crucible 1. A lower furnace body 9 is arranged to surround the nozzle portion 1c and its surround space 12, and a heater 10B is buried in the lower furnace body 9. The configuration of the heating furnace may be varied in various ways. For example, although the heating furnace is divided into two zones in FIG. 3, it may be divided into three or more zones. Both the main body and the nozzle portion 1c of the crucible are made of carbon coated with pyrolytic BN or silicon.

A high frequency heater 98 is provided to surround the nozzle portion 1c, and an electric power source 16 is connected to the high frequency heater 98.

Inside a space 12 may be arranged an after-heater (not shown) to surround the nozzle 1c and its under area. The temperature distribution of the spaces 11 and 12 is appropriately set by generating heat in the upper and lower furnace bodies 8 and 9 including any necessary after-heater (not shown), and a raw material for the melt is fed into the crucible. The gravitational force applied to the melt inside the nozzle portion 1c is largely reduced through contact between the inner wall surface of the nozzle portion 1c and the melt.

An end face of a seed crystal 13 is contacted with a surface of the melt at a lower end face of the growth member 5, and the seed crystal 13 is pulled downwardly. The seed crystal may be a single silicon crystal or a silicon polycrystal. A uniform solid-liquid interface is formed between the upper end of the seed crystal 13 and the melt drawn down from the nozzle portion 1c. As a result, a crystalline silicon plate 7 is continuously formed on the upper side of the seed crystal 13, and downwardly pulled. The reference numeral 14 denotes a carrier unit in the form of a block, and the reference numeral 49 denotes a cut position of the seed crystal.

A diffusion member 17 made of a compound including a P type or N type doping element is arranged under the growth member 5. As to such a doping element, it is preferable that boron is used as a P type element, whereas phosphorus is used as a N-type element, and that boron nitride is used as a P-type compound and phosphosilicate glass is used as an N-type compound. FIG. 4(a) is an enlarged sectional view showing that a diffusion member 17 is arranged on a side of the crystalline silicon plate. FIG. 4(b) is a perspective view showing that the diffusion member 17 is arranged on the side of the crystalline silicon plate. The diffusion member 17 having, for example, a rectangular parallelepiped shape is arranged at a side of one main plane 18a of the crystalline silicon plate 18 at a given interval. Although the surrounding temperature needs to be a temperature suitable for diffusion of the above element, this temperature could be easily understood by the skilled person in the art.

For example, if BN is used as a diffusion source, borosilicate glass is formed with a vapor from BN, and a P-N joint is formed by diffused B in the plate in an oxidizing atmosphere.

By so doing, while the crystalline silicon plate 18 is being gradually pulled downwardly, the above element is diffused into the plate 18 through its surface. As a result, a diffused area zone 19 is formed in one main plane side of the crystalline silicon plate 18, and a PN junction is formed between the diffused area 19 and a non-diffused area 20. The diffused distance is required to be 5 to 10 μm.

A solar cell element 21 as shown in FIG. 4(c) can be easily produced by using the thus obtained crystalline silicon plate 18. Reference numerals 23 and 24 denote a light-emitting side electrode and a rear side electrode, respectively. Although a PN junction is conventionally formed after the crystalline silicon plate is cut out, according to the present invention, the PN junction may be continuously formed inside the growth unit, while the extremely thin crystalline silicon plate 18 is being pulled down.

In a preferred embodiment according to the present invention, a reinforcing projection having a thickness of 30 to 1500 μm may be formed on at least a part of the main body of the crystalline silicon plate, while the main body of the crystalline silicon plate is being grown in a thickness of 5–200 μm. By so doing, a necessary amount of silicon for the entire crystalline silicon plate can be largely reduced, and the crystalline silicon plate can be prevented from being broken in handling, e.g., transferring the crystalline silicon plate, forming an electrode on it, or assembling the crystalline silicon plate into a module.

To form the reinforcing member having a thickness greater than that of the main body of the crystalline silicon plate is formed on this main body, a projection-forming member having a tip having a shape corresponding to the sectional shape of the reinforcing element is preferably arranged under a lower portion of the draw-out opening.

FIG. 5 is a perspective view for schematically showing an another embodiment for the above purpose in which the crystalline silicon crystal plate is being produced, and FIG. 6 is a sectional view of FIG. 5. A planar growth plate 90 is arranged on one side of the nozzle portion 1c, while a tip portion 90a of the growth plate 90 is located under the draw-out member. On a side of the nozzle portion 1c opposite the growth member 90, for example, a given number of rod-shaped projection-forming members 25 are located, while the tip portions 25a of the respective projection-forming members 25 are located under the draw-out opening 4.

As shown in the embodiments of FIGS. 1 and 2, a main body 27 of the crystalline silicon plate is pulled down from the tip portion of the growth member 90. Simultaneously, a part of the melt flows along the tip portions 25a of the projection-forming members 25, which forms reinforcing projections 28 on the main body 27. In this embodiment, the reinforcing projections 28 extend in a direction of pulling down the crystalline silicon plate, i.e., in an arrow A direction.

In order to stably form the reinforcing projections with a uniform height, it is preferable that the tip of the growth member 90 is approached to those of the projection-forming members 25 as small as possible, and that a common melt reservoir 6 is formed above the tip portions of the growth member and the projection-forming members.

In the embodiment of FIGS. 5 and 6, the plate-growth member 90 and the projection-forming members 25 are located at the opposite sides of the nozzle portion 1c, respectively, but they may be arranged in the same side. Further, either the growth member and the projection-forming members may be inserted in the nozzle portion 1c and the crucible 1.

In the above embodiment, if the projection-forming members are moved in a direction almost parallel to the main plane of the crystalline silicon plate when the crystalline silicon plate is pulled down from the growth member, the reinforcing projections are formed on the crystalline silicon plate, and extend in a direction inclined to the direction of pulling down the crystalline silicon plate. By so doing, since the configuration of the reinforcing projections can be freely varied on the crystalline silicon plate, the reinforcing projections can be formed in a reinforcing planar form such as a lattice-fashioned form or a wavy form as mentioned later.

FIGS. 7(a) and 7(b) are enlarged views for illustrating the formation of the above reinforcing projections. FIG. 8(a) is a front view of a crystalline silicon plate 92 obtained by this forming method. The crystalline silicon plate 92 of FIG. 8(a) includes a main body 27 and thick portions projecting from the surface of the main body 27, i.e., reinforcing projections 97 in the lattice form.

In order to form the above lattice-fashioned projections, as shown in FIGS. 7(a) and 7(b), all the projection-forming members 25A, 25B, 25C, 25D, . . . are designed movable in a direction almost parallel to the main plane of the silicon crystal plate 92. For this purpose, each of the projection-forming members is connected to a holder and a holder-driving mechanism (not shown).

The projection-forming members 25A, 25B, 25C and 25D form the reinforcing projections 93a, 93b, 93c and 93d, respectively. In FIG. 7(a), the projection-forming members 25A and 25B are almost contacted with each other, whereas the projection-forming members 25C and 25D are almost contacted with each other. Immediately after this, the projection-forming member 25A is moved in an arrow J-direction, and the projection-forming member 25B is moved in an arrow K-direction. On the other hand, the projection-forming member 25C is moved in an arrow L-direction, and the projection-forming member 25D is moved in an arrow-M-direction. The projection-forming members move, which reach the state in FIG. 7(b).

In FIG. 7(b), the projection-forming members 25A and 25B are separated from each other, whereas the projection-forming members 25B and 25C almost contact each other. On the other hand, the projection-forming members 25C and 25D are most separated from each other. The other projection-forming members not shown move in a similar manner. If the projection-forming members are moved at a constant speed from the state of FIG. 7(a) to the state of FIG. 7(b), the almost linear projection portions are formed as shown in FIG. 7(b). When the projection-forming members 25B and 25C are almost in contact with each other, the reinforcing projection portions 93b and 93c contact each other to form an intersection 94. Intersections in FIG. 7(a) are formed in this manner.

Next, immediately after the state in FIG. 7(b), the projection-forming members 25A and 25B are moved in arrow N- and O-directions, respectively, whereas the projection-forming members 25C and 25D are moved in arrow P- and Q-directions, respectively. The projection-forming members move and reach the state as shown in FIG. 7(a). By repeating the above steps, the crystalline silicon plate 92 having the lattice-fashion reinforcing projections 97 shown in FIG. 8(a) is continuously grown. The reinforcing projection portions 93e and 93f are formed in the same manner as mentioned above.

The crystalline silicon plate 95 shown in FIG. 8(b) includes a main body 27, and curved or wavy reinforcing projections 96a, 96b, 96c and 96d located on the main body. The reinforcing projections extend almost in parallel to one another. In this case, the moving speeds of the respective projection-forming members need to be appropriately controlled, while the distance between adjacent ones is kept constant. The thus obtained crystalline silicon plate has almost the same strength as that of the plate in FIG. 8(a). Since intersections need not be formed by contacting the projection-forming members, the locations of the projection-forming members can be readily controlled.

When the reinforcing projections are formed on one main plane of the crystalline silicon plate, a uniform PN junction can be formed through uniform diffusion of the above element even if the above diffusion member is located on a side of the reinforcing projections or on its opposite side. However, if electrodes are formed by vapor deposition or the like on the crystalline silicon plate through a mask placed on it, a PN junction is preferably so formed that light may be irradiated upon the side opposite to the side where the reinforcing projections are present, because the reinforcing projections may disturb the installation of the mask for the vapor deposition.

FIGS. 9(a) through 9(c) illustrate another crucible suitable for growing the crystalline silicon plate. As shown in FIG. 9(a), plural rows of slender grooves 32 are formed in parallel to one another at a planar plate 31. As shown in FIG. 9(b), two such flat plates 31 are bonded to each other to form a planar nozzle portion 33 in which plural rows of melt flow holes 37 are formed. A reference numeral 34 denotes a seam.

As shown in FIG. 9(c), the nozzle portion 33 is joined to a bottom of a crucible 36. A melt in the crucible 36 flows down outwardly through the melt flow holes 37 of the nozzle portion 33. At that time, the melts flowing out through the melt flow holes 37 are united at a bottom face 35 of the nozzle portion, so that a melt reservoir is formed immediately under the bottom face 35 to make the united melt flow along the surface of the plate member for growth. When the crucible and the nozzle portion thus constructed are used, the melt flow holes having a small diameter can be readily produced to form the crystalline silicon plate.

FIG. 10 is a schematic view for illustrating a further embodiment using a crucible with plural draw-out openings. A melt 3 is charged in the crucible 39. A main body 39a of the crucible 39 has a slender configuration as shown in FIG. 9. Plural, for example, three, rows of nozzle portions 39b are formed in a bottom portion of the main body 39a, and extend downwardly. A melt flow hole 40 is formed in each of the nozzle portion 39b, and a draw-out opening 4 is provided at each melt flow hole 40.

A growth plate member 5 is fixedly arranged at a side of each nozzle portion 39b in the same manner as in FIGS. 1 and 2. By so constructing, a crystalline silicon plate 7 is pulled down in an arrow A direction through each of the draw-out openings 4. Any of the growth members, the silicon plate, the crucibles, etc. as shown in FIGS. 1 to 9 may be employed.

According to the present invention, the following apparatus and the process are particularly preferably used to continuously grow the crystalline silicon plate.

It was confirmed that a process for continuously forming discrete crystalline silicon plates by continuously moving the grown plate downwardly and intermittently cutting the growing plate is a process which enables a number of crystalline silicon plates having a given shape to be industrially stably mass-produced.

A moving apparatus to be used for this purpose preferably includes a pair of rotary bodies for sandwiching the plate therebetween, and a driving unit for rotating the rotary bodies. When the rotating bodies are rotated in the state that the plate is sandwiched between a pair of the rotary bodies, the plate is continuously moved downwardly. In this case, a space for the mechanical parts can be reduced. Further, since the pressure of the rotary bodies upon the plate is stabilized with the lapse of time, there is extremely small chance that the crystallinity of the plate is deteriorated through application of stress upon a part of the plate. This embodiment is particularly suitable for pulling down the crystalline silicon plate.

In this embodiment, if the plate is at a high temperature, particularly if its temperature exceeds 200° C., an adverse effect may occur upon the plate depending upon the material of the rotary bodies. In view of this, the rotary bodies are preferably made of a heat resistive resin such as Teflon. Further, if the seed crystal is pulled down by the rotary bodies and subsequently the plate is continuously pulled down, it may be difficult for the rotary bodies to smoothly move over a boundary between the seed crystal and the plate because the seed crystal and the plate have different dimensions. Therefore, it is preferable that the seed crystal is pulled down by another exclusively pulling down mechanism.

Further, according to other preferable embodiment, the plate moving apparatus includes plural holders for holding the plate, and a driving unit for vertically moving each of the holders. First, while the plate is held by one holder, this holder is moved downwardly. Then, the other holder is moved downwardly in the state that the plate is held by this holder. The above steps are repeated. According to this method, even if the dimension or the shape of the plate change in various ways, such can be easily coped with by adjusting the distance between a pair of chucks of the holders.

However, there is a problem in this embodiment that vibration or deviation of a central axis occurs by stress applied to the plate the moment the plate is held by the chucks of the holders. In order to prevent this, it is effective to simultaneously chuck plural locations of the plate. If a center between a pair of the chucks is not aligned with that of the plate when the plate is grasped by a pair of the chucks, any stress applied to the plate from one of the chucks may degrade the crystallinity of the plate. In order to prevent this, the chucks are preferably detachable so that the locations of the chucks may be adjusted or corrected to make the center of a pair of the chucks in conformity with that of the crystal plate.

According to the present invention, a pulling-down device for pulling down the plate is necessary. Although the plate may be descended owing to the self-weight of the melt inside the crucible, the crystallinity of the plate comes to be deteriorated in this method.

In a preferred embodiment, a cutter to be used for the aforementioned cutting is a cutter including a heating wire which cuts the plate through fusing by heating the heating wire. This is done by locally fusing the plate through instantly raising the temperature of the heating wire. According to this method, negligible stress is applied to the plate, and the crystallinity of the plate is not damaged.

In a further preferred embodiment, a cutter which the plate is cut through fusion by irradiating laser beam upon the plate. This method exerts completely no mechanical force upon the plate, which does not cause degradation of the crystallinity of the plate. Further, it is easy to set the cutter relative to the plate. Preferably, a carbon dioxide laser is used.

As a further preferred embodiment, a cutter which cuts the plate by mechanically breaking the plate through pressing a cutting member against the plate is used. In this case, in order to reduce mechanical stress applied upon the plate, scissors having tips with a small sectional area or a shearing member is preferably used.

As a further preferred embodiment, a raw material feeder is provide to automatically feed a raw silicon material into the melt. In this case, the raw material can be continuously fed into the crucible at a constant feed rate. Alternatively, a given amount of the raw material can be fed into the crucible at a given interval.

In this case, the raw material can be fed into the crucible according to a given problem from the beginning. However, a preferred embodiment includes a measurement instrument for measuring the height of the surface of the melt and controller for maintaining the height of the surface of the melt in a given range through controlling the feed rate of the raw material based on signals from the measuring instrument. Although the growing state of the plate changes in various ways, the thermodynamic condition near the melt draw-out opening can be kept constant by the above controlling, so that the crystallinity and the composition of the plate can be maintained constant.

In the above case, if a thermocouple is placed as the measuring instrument in the melt inside the crucible such that the thermocouple is arranged near the surface of the melt, a temperature detected by the thermocouple decreases with reduction in height of the melt. The controller receives a signal to that effect, and outputs an order to the raw material feeder to feed the raw material into the crucible. In this embodiment, if the raw material is fed by a batch system, the crystallinity may be adversely affected through reduction in the temperature of the melt at the moment the raw material is fed to the melt. Therefore, it is preferable that while the raw material is continuously fed into the melt at a given speed, the temperature near the melt is simultaneously measured by the thermocouple, and a small amount of the raw material is fed if the temperature measured decreases. By so doing, the weight of the raw material fed into the melt by the batch system can be reduced. Since the temperature of the melt inside the crucible exceeds 1000° C., the thermocouple is preferred.

A further preferred embodiment includes a measuring instrument for measuring the change in the weight of the melt, and a controller for maintaining the weight of the melt in a given range by controlling the feed rate of the raw silicon material based on signals form the measuring instrument. In the same manner, the crystallinity of the plate can be kept constant.

A still further preferred embodiment includes a watching unit for watching the shape of the plate, and a controller for controlling the shape of the plate based on information from the watching unit. By so constructing, if the shape of the plates changes during the automatic mass production thereof, the shape can be corrected. More specifically, if the dimension of the plate becomes greater than a specified one, a change amount in the dimension is detected, and a signal corresponding to this dimensional change amount is transmitted to the controller. The controller transmits a temperature control signal to the heater inside the furnace. If a signal to slightly raise the temperature is transmitted to the heater, the dimension of the plate can be slightly decreased. Further, the dimension of the plate can be slightly increased by transmitting to the heater a signal to slightly lower the temperature.

As the shape-measuring unit, a monitoring device is available, which monitors the outer shape of the plate through taking the image of the plate with a CCD camera. However, since the absolute amount of the actual dimension of the plate cannot be grasped, a standard scale is preferably set near the plate. Further, since this method has a problem that the image of the plate is dark, a light is preferably installed near the plate.

As mentioned above, while the crystalline silicon plate is being pulled down, the P type or N type dope element is continuously diffused into the plate to continuously produce the solar cell element. In this case, the resistance value of the PN junction formed on the plate and its electric power generating capability are measured, and based on measurement results, the distance of the crystalline silicon plate and the diffusion member can be increased or decreased and/or the temperature around the diffusion member can be increased or decreased. By so doing, the PN junction having a given resistance value and a given electric power generating ability can be stably made in a mass production scale.

A further preferred embodiment includes a transfer device for automatically arraying and then transferring plates after cutting. Since the plates are automatically transferred to a next step as they are in an arrayed state, this embodiment is particularly preferred from the standpoint of the mass production. In particular, this embodiment is extremely favorable when the plates are to be used as solar cell elements, because the plates having the PN junction continuously formed can be transferred to a next polishing step in the arrayed state.

FIG. 11 is a block diagram for schematically illustrating an embodiment of the crystalline silicon plate-producing apparatus according to the present invention. Heaters 10A and 10B are arranged in upper and lower furnace bodies 8 and 9, respectively. Thermocouples 45A, 45B, 45C, 45D and 45E are provided at given locations inside the upper and lower furnace bodies. Signal lines extend from respective thermocouples to a controller 50. A crucible 44 is arranged inside an inner space of the upper furnace body 8, and a plate 7 is pulled down into an inner space of the lower furnace body 9 through a nozzle portion of the crucible 44. The specific configurations of the parts near the plate are as mentioned above, and therefore no details are shown. A raw material feeder 42 is arranged above the upper furnace body 8, and a feed line 42a of the raw material feeder 42 is opened toward an upper face of the crucible 44. The raw material feeder 42 is connected to the controller 50.

A plate imaging device 43 is arranged under the lower furnace body 9, and this imaging device 43 is connected to a monitor 52. A moving device 47 schematically shown as a block is arranged under the imaging device 43, and a cutter 48 is arranged under the moving device 47. The moving device 47 and the cutter 48 are both connected to the controller 50. Referenced numerals 49 and 90 denote a cut position, and a cut plate having a given shape and a given dimension, respectively.

Under this plate 90 is arranged a transfer unit 14 to which the cut plate 90 is led. The controller 50 is watched and controlled at a terminal 51.

FIG. 12 is a perspective view for illustrating a preferred embodiment of the holder and the cutter to be used in the present invention, and FIG. 13 shows a side view for illustrating a principal portion thereof. FIG. 14 is a front view for illustrating a vicinity of a chuck of the holder. Feed screws 55A and 55B are arranged at a pair of frame bodies 50A and 50B, respectively. Holders 51A and 51B are fixed to the feed screws 55A and 55B, respectively. Cutters are arranged under the holders 51A and 51B, respectively. Each of cutting tools 53A and 53B of the cutters is connected to a cylinder 56 through a shaft 57. Motors 54A and 54B are received in a base table under the frame bodies 50A and 50B. The motors 54A and 54B are operated to rotate the feed screws, which vertically move the above holders and cutters.

FIG. 14 shows a specific construction of the holder 51A, 51B. A shaft 64 is connected to a cylinder 65, and a chuck 52A is fixed to the shaft 64 via a fixing member 60. The shaft 64 is structurally connected to a shaft 63 parallel to the shaft 64 via a link mechanism 62, and a chuck 52B is fixed to the shaft 62 via a fixing member 60B. The cylinder 65 is movable in directions shown by arrows G. If the cylinder 65 is moved left in FIG. 14, the shaft 64 and the chuck 52A move left, whereas the shaft 63 and the chuck 52B move right. Accordingly, the distance between the chucks 52A and 52B increases to release the plate from the holder. When the plate is to be held by the holder, the cylinder 65 is moved right in FIG. 14, the shaft 64 and the chuck 52A move right, and the shaft 63 and the chuck 52B move left.

When the plate is to be moved downwardly in the state that plate is held by the holder, an outer peripheral surface portion is first held by the holder 51B, and then the holder 51B is moved downwardly to a given location by driving the feed screw. At that time, as shown in FIG. 13, the cutting tool 53B is projected and contacted with the plate by driving the cylinder, and the plate is cut by applying pressure upon the plate via the cutting tool. Then, the plate is released from being held with the holder 51B, and the plate is held at a given location with the holder 51A, followed by downward movement of the holder 51A down to a given location. In this way, the plate is downwardly moved and cut, while the plate is alternatively switchingly held by the holders 51A and 51B. Consequently, the plate is automatically moved and cut. The various parts are controlled by the controller. The controlling ways are known, and conventional ones may be employed.

FIG. 15 is a side view for schematically illustrating a plate moving device and a plate cutter according to a further preferred embodiment of the present invention. FIG. 16 is a perspective view for illustrating a driving mechanism for a pair of rotary bodies. A rotary shaft 70B is fixedly connected to a rotary shaft of a motor 66 via a gear chamber 67, and a pair of wheels 68 are fixed around the rotary shaft 70B, while a gap 76 is present between a pair of the wheels 68. A rotary body 69B is thus constructed. A rotary shaft 70B is to be synchronized with the rotary shaft 70A via a mechanism no shown. A pair of wheels 68 are fixed around the rotary shaft 70A, while a gap 76 is present between a pair of the wheels 68. A rotary body 69A is thus constructed. A plate 72 is fed downwardly, while being held between a pair of the wheels 69A and 69B.

A cutter 74 is provided under the moving device. A cutting blade 73 is connected to a driving unit of the cutter 74. The plate 72 is cut by contacting the cutting blade 73 with the plate and shearing it through applying pressure thereupon. The sheared plate falls downwardly to a receiving box 99 along a chute 75. In FIG. 15, the plate 72 is supported on one side (on the right side in FIG. 1), but if such supporting is insufficient, the mechanism shown in FIGS. 15 and 16 are provided at each of the opposite sides of the plate 72 to support the opposite faces of the plate.

The plate may be cut by fusing with a heater. For example, as schematically shown in FIG. 17(a), a heater 80 is arranged against the plate 7. As shown in FIG. 17(b), the heater 80 is heated to locally heat the plate 17, and is moved in an R-arrow direction to cut the plate 7 through fusion, thereby obtaining a plate 81.

In FIG. 18(a), a plate 83 appears on a screen 84 of a monitor 82. A scale 85 is arranged vertically to a running direction of the plate 83. The outer size of the plate 83 is measured by this scale 85.

As shown in FIG. 18(b), a laser beam 87 is irradiated upon an outer peripheral portion of a plate 86, and an x-direction size of the plate 86 is measured by leading a portion of the irradiated light not interrupted by the plate 86 to a light receiving unit not shown. At the same time, an y-direction size of the plate 86 can be measured by irradiating a laser beam 88 orthogonal to the laser beam 87 upon the outer peripheral portion of the plate 86 and leading a portion of the irradiated light not interrupted by the plate 86 to a light receiving unit not shown.

(Experiments)

In the following, more concrete experimental results will be explained.

A crucible having the construction as shown in FIGS. 1 and 2 was used together with a growth member and projection-forming members as shown in FIG. 5. The entire construction of the growth apparatus was the same as schematically shown in FIG. 11. Into the carbon crucible 1 was fed 500 g of a raw silicon powder, via a raw material feeder 42, to which phosphorus had been added to give a concentration of $10^{-14}$ $cm^{-3}$ as an impurity. The planar growth member 90 with a tip portion having a thickness of 100 $\mu$m and a width of 150 mm was arranged at a tip of the nozzle portion of the crucible 1 as shown in FIG. 5. The growth member 90 was made of carbon fibers having a diameter of 10 $\mu$m. Argon gas was flown in a chamber, and the plate was grown in an inert atmosphere.

Independently from this growth member, five rows of the projection-forming members 25 were provided as shown in FIG. 5. The dimension of the tip portion 25a of each of the projection-forming member 25 had a diameter of 100 $\mu$m, and the tip portion 25a of the projection-forming member 25 was almost contacted with the tip portion of the growth member. A driving means not shown was connected to each projection-forming member.

A continuous raw material feeder 42 was arranged above the crucible, and the feeding of the raw material was controlled depending upon signals from a weight detector arranged above the crucible. The entire furnace body of the growth furnace was constituted in the form of a radio frequency heating or a resistive heating or a combination thereof so that the temperature of every portion inside the growth furnace might be controlled. In particular, the temperature gradient in the vicinity of a crystal growth point at a tip of the nozzle portion 1c was adapted to be controlled depending upon signals from a crystal growth watching unit.

While the temperature of the crucible was adjusted to 1500° C., a powdery raw material was melted inside the carbon crucible. The temperature of the nozzle portion was kept near 1450° C. The temperature gradient of near the crystal growth point was optimized by heat transmission from the carbon crucible 1 to the nozzle portion and the heat generation of an after heater under the nozzle portion.

In the growth apparatus shown in FIG. 11, a pulling down unit was controlled to be drawn at a uniform vertical pulling speed of 100 to 10,000 mm/hour. This pulling unit was provided with a unit for watching the shape and the dimension of the plate with a CCD camera and a unit for carrying a cut plate.

On an initial shooting, a seed crystal plate was contacted with the tip of the growth member from the lower side. While a meniscus at an interface between a solid phase and a liquid phase was kept optimum, the grown crystal was continuously pulled down at a constant speed of 1200 mm/hour. This plate had a uniform thickness of 50 $\mu$m whereas reinforcing projections 97 having a thickness of 100 $\mu$m and a width of 100 $\mu$m could be formed.

A constant temperature zone at a temperature of 800° C. having a length of about 50 mm was provided at a point through which the plate passed. As shown in FIGS. 3 and 4, a BN (boron nitride) sintered body having a dimension of 50 mm×150 mm×20 mm was arranged in the constant temperature zone such that the sintered body was arranged on that side of the plate where no reinforcing projections were formed. This sintered body was spaced from the plate by a distance of 300 $\mu$m. An oxidizing atmosphere zone at 1150° C. was provided under the constant temperature zone so that a complete P-N junction might be formed.

When the plate reached a length of about 400 mm, as shown in FIG. 15, both sides of the plate were grasped by continuous feeding rollers, a cutting mechanism was contacted with the plate, and the seed crystal portion was cut off with carbon dioxide laser. Then, the remaining plate was successively fed downwardly, plates were cut, arrayed and conveyed as mentioned above.

As the plate grows, the amount of the melt in the crucible decreases. Reduction in weight of the melt was measured by a load cell, and the feeding of the powdery raw material was controlled by operating the raw material feed mechanism based on the measurement result such that the total weight of the crucible and the melt might be constant. Control was effected such that the above changes in weight might be in an error range of ±10 mg.

Next, the shape and the dimension of the continuously grown plate were measured, including the thickness of the plate, and the temperature gradient near the growth crucible and the nozzle portion was controlled based on the measurement results. An electric resistance of the PN junction was measured, and controlling was effected in that the distance between the diffusion member and the silicon crystal plate was increased or decreased or the temperature of the constant temperature zone in which the diffusion member was arranged was increased or decreased.

Since the plate grew by a length of 150 mm in about 7 minutes, the grown silicon crystal plate was cut by moving the carbon dioxide laser every seven minutes, thereby continuously producing plates each having a dimension of 150 mm×150 mm×50 μm with reinforcing projections being 150 μm.

The grown and cut plates were automatically arrayed and conveyed. That main plane of each of the plates conveyed at which boron was diffused and which was flat without reinforcing projections formed was polished, a transparent electrode was formed, and an aluminum electrode was formed by mask vapor deposition. Continuously to this, an aluminum electrode was formed on a rear face of the plate where the reinforcing projections were formed. Thereby, a solar cell element was obtained.

The silicon crystal plate thus grown was a complete single crystal or a polycrystalline body composed of an aggregate of single crystals each having a dimension of 10 to 70 mm. The solar cell elements had an electric power generating efficiency of about 18%, which was almost equal to a theoretical value. This solar elements were extremely stable in that the electric power efficiencies varied in a range of ±1%.

As having been described above, according to the present invention, the thin silicon crystalline plates can be uniformly and continuously grown.

What is claimed is:

1. A process for growing a crystalline silicon plate, comprising the steps of:
   providing a growth crucible containing a melt of silicon and having a melt draw-out opening at a lower side thereof;
   providing a growth member having a tip portion;
   arranging said growth member at an incline such that only said tip portion thereof is positioned under said draw-out opening and an upper surface of said growth member faces said draw-out opening;
   drawing out the melt from the crucible through the draw-out opening and bringing the drawn out melt into contact with only said tip portion of said growth member; and
   growing the crystalline silicon plate by further pulling down the melt only from said tip portion of said growth member.

2. The process set forth in claim 1, wherein at least the tip portion of the growth member is made of a bundle of carbon fibers.

3. The process set forth in claim 1, wherein at least the tip portion of the growth member is made of a bundle of silicon carbide fibers.

4. The process set forth in claim 1, wherein the crystalline silicon plate has a thickness of not less than 5 μm to not more than 200 μm and a width of not less than 3 mm.

5. The process set forth in claim 2, wherein the crystalline silicon plate has a thickness of not less than 5 μm to not more than 200 μm and a width of not less than 3 mm.

6. The process set forth in claim 3, wherein the crystalline silicon plate has a thickness of not less than 5 μm to not more than 200 μm and a width of not less than 3 mm.

7. The process set forth in claim 1, further comprising the steps of:
   arranging at least one projection-forming member having an end-tip portion located under the draw-out opening;
   contacting a part of the drawn out melt with the end-tip portion to thereby form a reinforcing projection integrally on the crystalline silicon plate; and
   pulling down the drawn out melt through the end-tip portion, said end-tip portion having a shape corresponding to a cross section of the reinforcing projection.

8. The process set forth in claim 2, further comprising the steps of:
   arranging at least one projection-forming member having an end-tip portion located under the draw-out opening;
   contacting a part of the drawn out melt with the end-tip portion to thereby form a reinforcing projection integrally on the crystalline silicon plate; and
   pulling down the drawn out melt through the end-tip portion, said end-tip portion having a shape corresponding to a cross section of the reinforcing projection.

9. The process set forth in claim 3, further comprising the steps of:
   arranging at least one projection-forming member having an end-tip portion located under the draw-out opening;
   contacting a part of the drawn out melt with the end-tip portion to thereby form a reinforcing projection integrally on the crystalline silicon plate; and
   pulling down the drawn out melt through the end-tip portion, said end-tip portion having a shape corresponding to a cross section of the reinforcing projection.

10. The process set forth in claim 4, further comprising the steps of:
    arranging at least one projection-forming member having an end-tip portion being located under the draw-out opening;
    contacting a part of the drawn out melt with the end-tip portion to thereby form a reinforcing projection integrally on the crystalline silicon plate; and
    pulling down the drawn out melt through the end-tip portion, said end-tip portion having a shape corresponding to a cross section of the reinforcing projection.

11. The process set forth in claim 7, wherein the crystalline silicon plate is pulled down through the tip portion of the growth member, and the reinforcing projection is formed on the crystalline silicon plate in a direction inclined to a direction of pulling down the crystalline silicon plate by moving said at least one projection-forming member approximately in parallel to a main plate of the crystalline silicon plate.

12. The process set forth in claim 1, further comprising the steps of:
    providing a diffusion member made of a compound comprising an element being capable of being diffused into the crystalline silicon plate through a surface of the crystalline silicon plate;

arranging said diffusion member under at least the tip portion of the growth plate; and diffusing said element into a surface portion of the crystalline silicon plate from the diffusion member in the state that the temperature of each of the diffusion member and the crystalline silicon plate are controlled to a temperature suitable for diffusion, while the crystalline silicon plate is being pulled downwardly under the crucible.

13. The process set forth in claim 2, further comprising the steps of:

providing a diffusion member made of a compound comprising an element being capable of being diffused into the crystalline silicon plate through a surface of the crystalline silicon plate;

arranging said diffusion member under at least the tip portion of the growth plate; and diffusing said element into a surface portion of the crystalline silicon plate from the diffusion member in the state that the temperature of each of the diffusion member and the crystalline silicon plate are controlled to a temperature suitable for diffusion, while the crystalline silicon plate is being pulled downwardly under the crucible.

14. The process set forth in claim 3, further comprising the steps of:

providing a diffusion member made of a compound comprising an element being capable of being diffused into the crystalline silicon plate through a surface of the crystalline silicon plate;

arranging said diffusion member under at least the tip portion of the growth plate; and diffusing said element into a surface portion of the crystalline silicon plate from the diffusion member in the state that the temperature of each of the diffusion member and the crystalline silicon plate are controlled to a temperature suitable for diffusion, while the crystalline silicon plate is being pulled downwardly under the crucible.

15. The process set forth in claim 4, further comprising the steps of:

providing a diffusion member made of a compound comprising an element being capable of being diffused into the crystalline silicon plate through a surface of the crystalline silicon plate;

arranging said diffusion member under at least the tip portion of the growth plate; and diffusing said element into a surface portion of the crystalline silicon plate from the diffusion member in the state that the temperature of each of the diffusion member and the crystalline silicon plate are controlled to a temperature suitable for diffusion, while the crystalline silicon plate is being pulled downwardly under the crucible.

16. The process set forth in claim 5, further comprising the steps of:

providing a diffusion member made of a compound comprising an element being capable of being diffused into the crystalline silicon plate through a surface of the crystalline silicon plate;

arranging said diffusion member under at least the tip portion of the growth plate; and diffusing said element into a surface portion of the crystalline silicon plate from the diffusion member in the state that the temperature of each of the diffusion member and the crystalline silicon plate are controlled to a temperature suitable for diffusion, while the crystalline silicon plate is being pulled downwardly under the crucible.

17. The process set forth in claim 6, further comprising the steps of:

providing a diffusion member made of a compound comprising an element being capable of being diffused into the crystalline silicon plate through a surface of the crystalline silicon plate;

arranging said diffusion member under at least the tip portion of the growth plate; and diffusing said element into a surface portion of the crystalline silicon plate from the diffusion member in the state that the temperature of each of the diffusion member and the crystalline silicon plate are controlled to a temperature suitable for diffusion, while the crystalline silicon plate is being pulled downwardly under the crucible.

18. A crystalline silicon plate-growth apparatus comprising a growth crucible in which a melt of silicon is placed and which is provided with a melt draw-out opening at a lower side thereof, a growth member and a driving mechanism, wherein said growth member is arranged at an incline such that only a tip portion thereof is positioned under said draw-out opening and an upper surface of said growth member faces said draw-out opening, and wherein said driving mechanism is adapted to bring the melt drawn out through the draw-out opening from the tip portion of said growth member and further pull down a crystalline silicon plate from the tip portion of the growth member.

19. A process for producing a solar cell element comprising a crystalline silicon plate as a substrate, having a P type or N type doping element at one of the main planes of the crystalline silicon plate, said process comprising the steps of:

providing a growth crucible containing a melt of silicon and having a melt draw-out opening at a lower side thereof;

providing a growth member having a permeable tip portion;

arranging said growth member at an incline such that only said tip portion thereof is positioned under said draw-out opening and an upper surface of said growth member faces said draw-out opening;

drawing out the melt from the crucible through the draw-out opening and bringing the drawn out melt into contact with only said tip portion of said growth member;

growing the crystalline silicon plate by further drawing down the melt only from said tip portion of said growth member;

providing a diffusion member made of a compound comprising an element being capable of being diffused into the crystalline silicon plate through a surface of the crystalline silicon plate;

arranging said diffusion member under at least the tip portion of the growth plate; and diffusing said element into a surface portion of the crystalline silicon plate from the diffusion member in the state that the temperature of each of the diffusion member and the crystalline silicon plate are controlled to a temperature suitable for diffusion, while the crystalline silicon plate is being pulled downwardly under the crucible.

20. The process set forth in claim 19, further comprising a melt reservoir located between said draw-out opening and the tip portion of said growth member along the upper surface of said growth member.

21. The process set forth in claim 20, wherein said melt reservoir has a substantially triangular cross-section.

22. The process set forth in claim 21, wherein said growth member is inclined.

23. The process set forth in claim 22, wherein the tip portion of said growth member is located at a lowermost point of said growth member.

* * * * *